(12) United States Patent
Nagatomo et al.

(10) Patent No.: US 7,615,746 B2
(45) Date of Patent: Nov. 10, 2009

(54) METHOD AND APPARATUS FOR EVALUATING PATTERN SHAPE OF A SEMICONDUCTOR DEVICE

(75) Inventors: Wataru Nagatomo, Yokohama (JP);
Atsushi Miyamoto, Yokohama (JP);
Ryoichi Matsuoka, Yotsukaidou (JP)

(73) Assignee: Hitachi High-Technologies Corporation, Tokyo (JP)

( * ) Notice: Subject to any disclaimer, the term of this patent is extended or adjusted under 35 U.S.C. 154(b) by 393 days.

(21) Appl. No.: 11/599,343

(22) Filed: Nov. 15, 2006

(65) Prior Publication Data

US 2007/0120056 A1 May 31, 2007

(30) Foreign Application Priority Data

Nov. 25, 2005 (JP) ............................. 2005-340268

(51) Int. Cl.
*G01N 23/00* (2006.01)
*G01B 11/14* (2006.01)

(52) U.S. Cl. ...................... 250/307; 250/310
(58) Field of Classification Search ................ None
See application file for complete search history.

(56) References Cited

U.S. PATENT DOCUMENTS

| 7,164,128 | B2 * | 1/2007 | Miyamoto et al. | 250/311 |
|---|---|---|---|---|
| 7,365,322 | B2 * | 4/2008 | Miyamoto et al. | 250/310 |
| 7,365,325 | B2 * | 4/2008 | Miyamoto et al. | 250/311 |
| 2002/0015518 | A1 * | 2/2002 | Matsuoka | 382/145 |
| 2005/0133718 | A1 * | 6/2005 | Miyamoto et al. | 250/307 |
| 2006/0193508 | A1 * | 8/2006 | Sutani et al. | 382/145 |
| 2006/0284081 | A1 * | 12/2006 | Miyamoto et al. | 250/307 |
| 2006/0288325 | A1 * | 12/2006 | Miyamoto et al. | 716/19 |
| 2007/0120056 | A1 * | 5/2007 | Nagatomo et al. | 250/310 |

FOREIGN PATENT DOCUMENTS

JP 2000-348658 12/2000

\* cited by examiner

*Primary Examiner*—David A Vanore
(74) *Attorney, Agent, or Firm*—Antonelli, Terry, Stout & Kraus, LLP.

(57) ABSTRACT

The present invention provides a semiconductor pattern shape evaluating apparatus using a critical dimension SEM, which eliminates the necessity of data conversion corresponding to each process of semiconductor manufacturing conventionally required; controls possessed data integratedly; can select data effective for use in each process from the possessed data easily; if the shape of formed pattern changes with time, can create a photographing recipe which enables stable measurement by correcting the photographing recipe based on time-series data. Specifically, the semiconductor pattern shape evaluating apparatus correlates coordinate systems among diversified data to control the diversified data stored in a database integratedly, selects part or all of the diversified data arbitrarily and creates a photographing recipe for observing a semiconductor pattern with a critical dimension SEM using selected data.

18 Claims, 22 Drawing Sheets

*FIG. 1A*
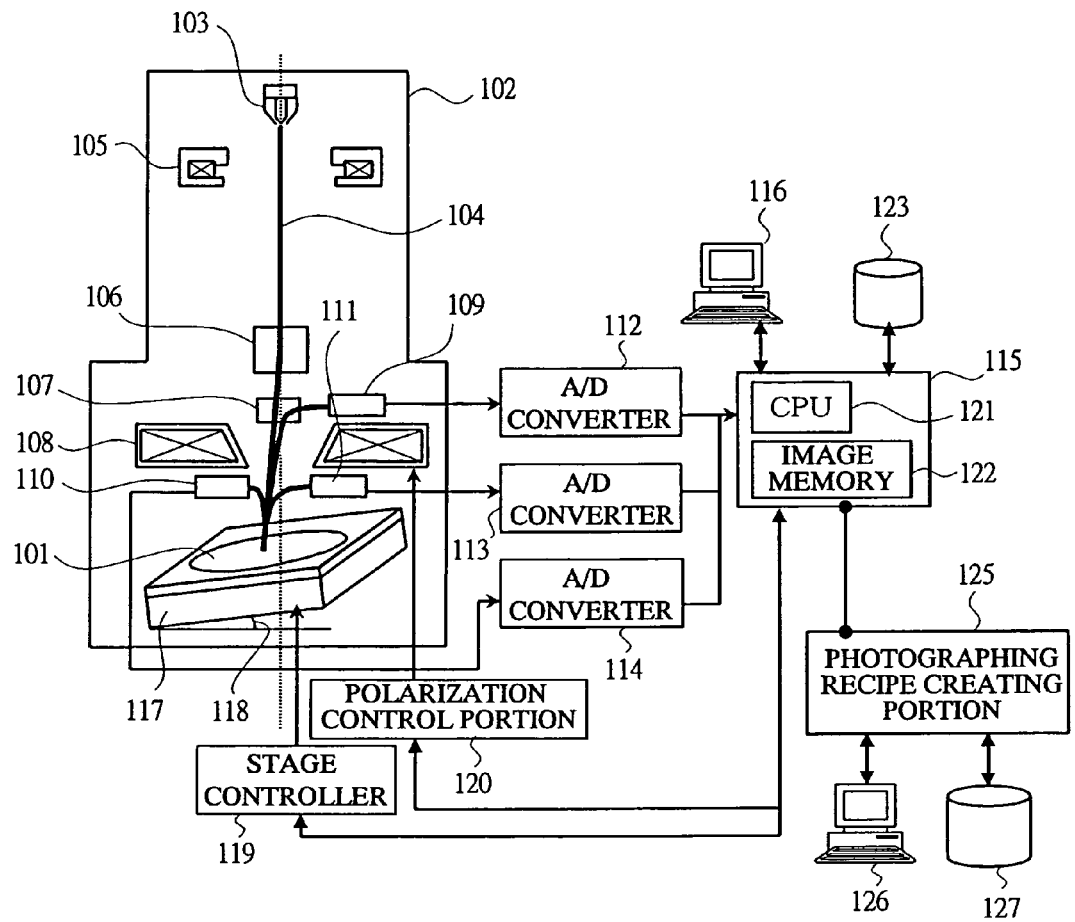
*FIG. 1B*
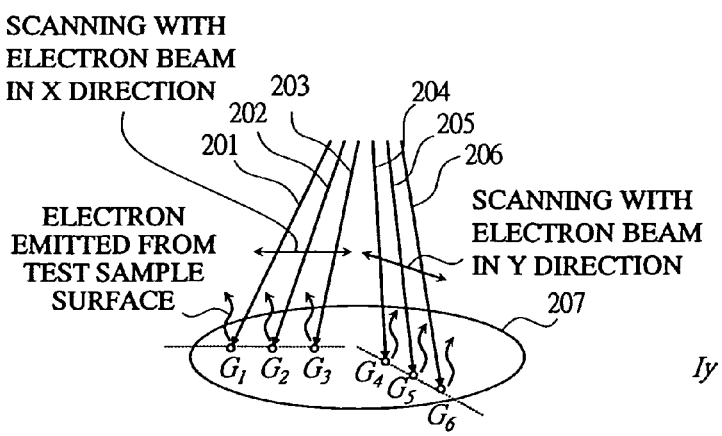
SCANNING WITH
ELECTRON BEAM
IN X DIRECTION
SCANNING WITH
ELECTRON BEAM
IN Y DIRECTION
ELECTRON
EMITTED FROM
TEST SAMPLE
SURFACE
*FIG. 1C*

LOGIC CIRCUIT DESIGN DATA

800

PATTERN DESIGN DATA 801
810

POST-OPC DATA 802
811

ACTUAL PATTERN MEASUREMENT DATA 803
812

ACTUAL MASK MEASUREMENT DATA 804
813

MASK DESIGN DATA 805
814

ELECTRON BEAM DRAWING SIMULATION RESULT DATA 806
815

PROCESS SIMULATION RESULT DATA 807
816

FIG. 8A
MEASUREMENT POINT
(DANGER POINT) DATA

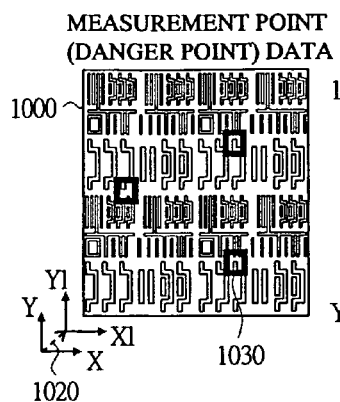

FIG. 8B
EACH TEMPLATE SELECTION
INDEX VALUE DATA

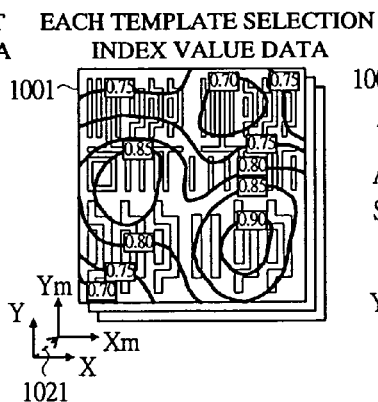

FIG. 8C
SELECTION
TEMPLATE DATA

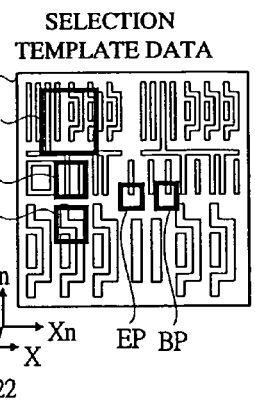

FIG. 8D
EACH TEMPLATE
PHOTOGRAPHING DATA

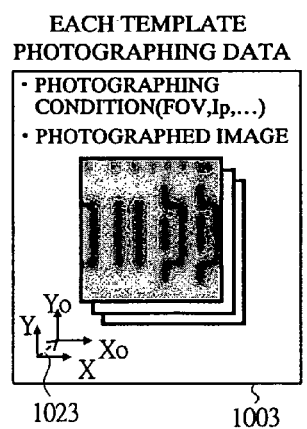

- PHOTOGRAPHING CONDITION(FOV,Ip,...)
- PHOTOGRAPHED IMAGE

FIG. 8E
MEASUREMENT POINT
PHOTOGRAPHING DATA

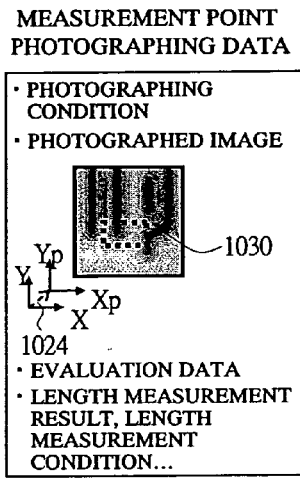

- PHOTOGRAPHING CONDITION
- PHOTOGRAPHED IMAGE
- EVALUATION DATA
- LENGTH MEASUREMENT RESULT, LENGTH MEASUREMENT CONDITION...

FIG. 8F
PROCESS CONDITION DATA

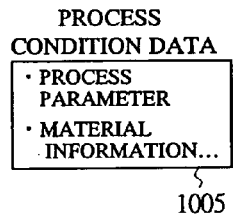

- PROCESS PARAMETER
- MATERIAL INFORMATION...

FIG. 8G
MASK DATA

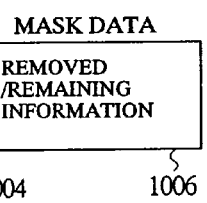

- REMOVED /REMAINING INFORMATION

FIG. 8H
MEASURING UNIT DATA

DATA INHERENT IN UNIT
- STAGE SHIFT ACCURACY
- BEAM SHIFT ACCURACY ...

(s1) MEASURED IMAGE STIGMATISM MAP   (s2) MEASURED IMAGE DISTORTION MAP

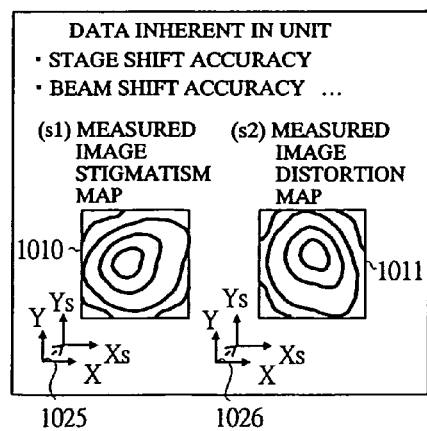

FIG. 8I
EACH TEMPLATE SUCCESS/
FAILURE DATA

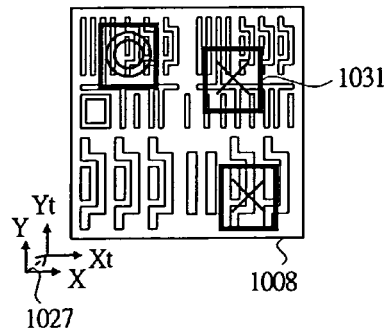

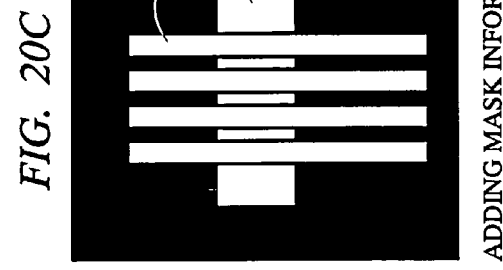
FIG. 20C ADDING MASK INFORMATION
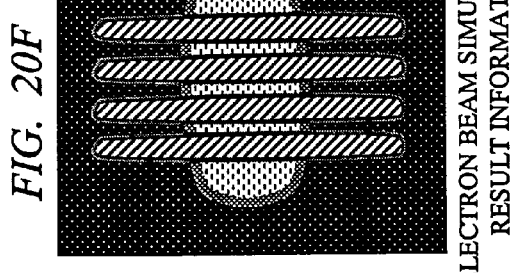
FIG. 20F ELECTRON BEAM SIMULATION RESULT INFORMATION
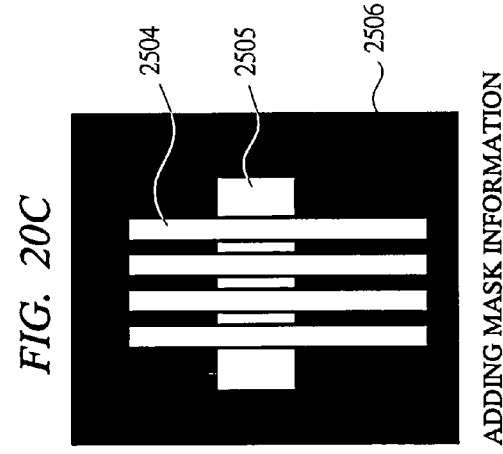
FIG. 20B LAYOUT (MULTI-LAYER)
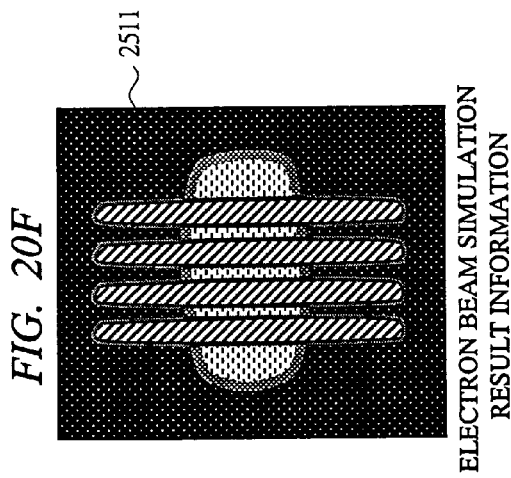
FIG. 20E PROCESS SIMULATION RESULT INFORMATION
FIG. 20A LAYOUT (SINGLE LAYER)
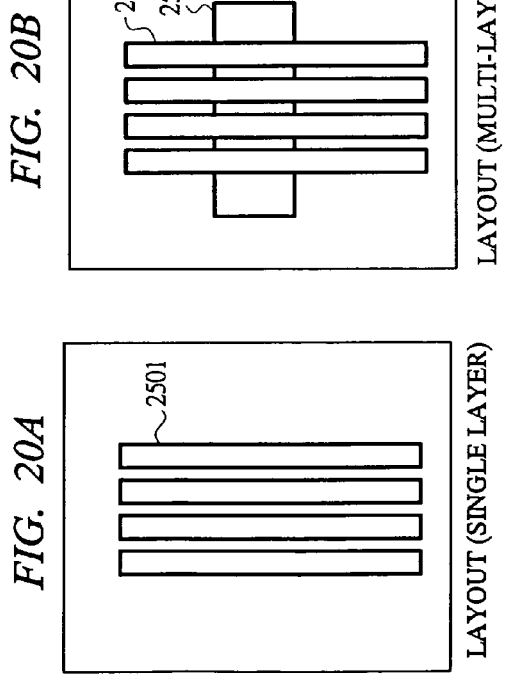
FIG. 20D ADDING MATERIAL INFORMATION

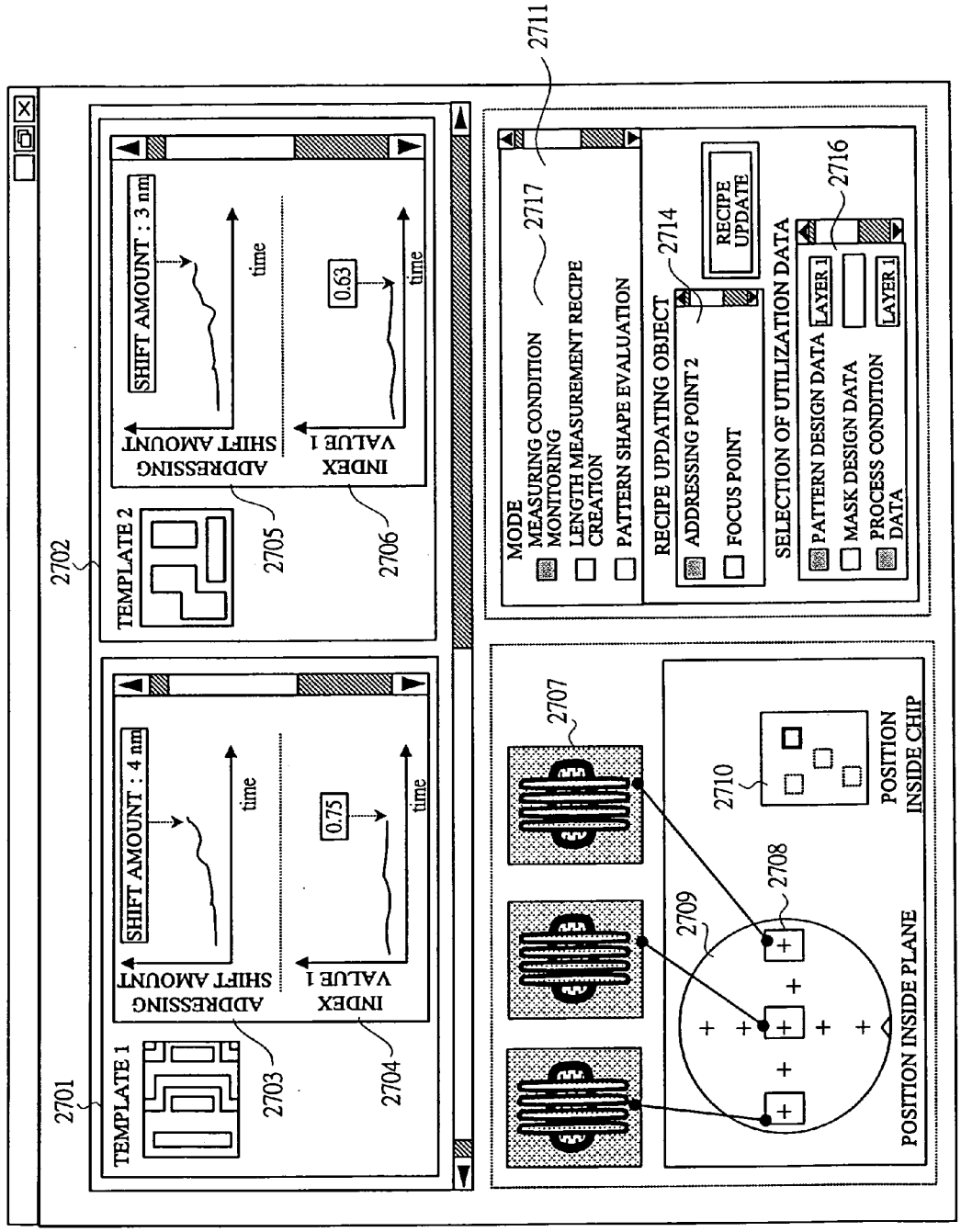

METHOD AND APPARATUS FOR EVALUATING PATTERN SHAPE OF A SEMICONDUCTOR DEVICE

CROSS-REFERENCE TO RELATED APPLICATION

The present application claims priority from Japanese Patent Application No. JP 2005-340268 filed on Nov. 25, 2005, the content of which is hereby incorporated by reference into this application.

TECHNICAL FIELD OF THE INVENTION

The present invention relates to a technology effectively applicable to a method for controlling a plurality of information employed by a method and apparatus for forming a pattern of a desired shape on a wafer in semiconductor manufacturing process. Particularly for evaluation of the shape of the formed pattern, which is an important step of semiconductor manufacturing process, photographing recipe necessary for photographing an arbitrary position on a test sample using a critical-dimension scanning electron microscope (CD-SEM) needs to be created and at this time, a plurality of information (pattern layout design data, measuring point information, measuring condition information and the like) are used. The present invention includes matters relating to a method for managing those pieces of information.

BACKGROUND OF THE INVENTION

For example, to form a pattern on semiconductor wafer, coating agent called resist is applied on the semiconductor wafer and the semiconductor wafer is irradiated with visible light, ultraviolet ray or electron beam with an exposure mask (reticle) of the pattern overlapping the resist, to expose the resist to light, so that a desired pattern is formed.

The exposure mask (reticle) is produced by drawing a pattern on an exposure mask using an electron beam drawing machine based on pattern design data (hereinafter, referred to as pattern design data). A mask original plate before a pattern is drawn is called blank mask and in many cases, inorganic thin film is formed of metal, oxide or nitride on a glass substrate. To create a pattern on the blank mask, resist film is created on the blank mask by, for example, coating and exposed to electron beam.

The pattern design data refers to data for disposing cells which constitutes a gate-level logic circuit within an LSI chip using EDA tool based on gate-level logic circuit design data which achieves a desired operation and further designing wiring for connecting them. When a pattern is formed on the blank mask using the electron beam drawing apparatus, preliminarily, mask drawing pattern design data (hereinafter referred to as mask design data) is created using the pattern design data, electron beam drawing apparatus condition and electron beam drawing simulation result data. Next, a pattern formed on the exposure mask using the electron beam drawing apparatus is inspected about whether or not its pattern forming condition is within an allowable range for mask design by using a mask inspecting device and if it is within the allowable range, the procedure proceeds to exposure process which is a next process. If it is out of the allowable range, the electron beam drawing apparatus is adjusted or the mask design data is corrected.

Because the tilt angle and shape of a slope portion of a pattern formed on the semiconductor wafer by the aforementioned exposure unit change depending on the intensity or diaphragm of electron beam of irradiated visible light, ultraviolet ray or electron beam, it is necessary to inspect completeness of the formed pattern by measurement in order to form high accuracy wiring pattern. The CD-SEM has been widely used for this inspection. A dangerous portion on a semiconductor pattern requiring inspection is observed with the SD-SEM as a measuring point and a variety of data such as wiring width of the pattern, a difference relative to pattern design data are computed from that observed image and then, the formed pattern is inspected based on the measured data. In mass production process, a process change is monitored by monitoring measurement data. As for the measuring point, a portion in which a shape change in the formed pattern might affect the chip performance largely is computed using, for example, device/process simulation and its result is stored as measuring point data. Upon inspection, a photographing recipe is created based on the measuring point data.

To form a desired pattern on the wafer as described above, (1) pattern design, (2) pattern formation using a semiconductor manufacturing apparatus, and (3) pattern completeness inspection using the semiconductor inspecting unit are necessary. Diversified data (for example, logic circuit design data, pattern design data, mask design data, mask photographing recipe, mask photographing result, resist pattern photographing recipe, resist pattern photographing result) need to be used in each process depending on requirement. Data for use in processing at each process include data absolutely necessary for each processing and data, which enables to create a more stable photographing recipe by using it and each data, is selected from possessed data and used. However, conventionally, often matching (matching of coordinate systems, scales and the like) among the respective data has not been secured and the respective data have been controlled separately so that they cannot be referred to by one another. For the reason, it is necessary to enter a module for converting each data to an appropriate format in between the respective data or for an operator to input necessary data manually, which is a cause for reducing the throughput of semiconductor pattern design cycle.

SUMMARY OF THE INVENTION

In the above conventional technology, it is necessary to combine diversified data created from each step of design, measurement and evaluation of semiconductor pattern design process in each process for pattern formation, pattern measurement and pattern completeness evaluation. However, there is such a problem that operator is demanded to execute processing for selecting necessary data from data stored in various steps, securing matching among the data and inputting the necessary data at each process.

Further, the shape of a formed pattern on the wafer might change with time and in this case, automatic measurement fails if the measurement is carried out using the same photographing recipe.

The above and other objects and novel characteristics of the present invention will be apparent from the description of this specification and the accompanying drawings.

The typical ones of the inventions disclosed in this application will be briefly described as follows.

Accordingly, the present invention provides a semiconductor manufacturing technology which eliminates the necessity of data conversion corresponding to each process conventionally necessary and can select data effective for use in each process easily from possessed data by controlling the possessed data integratedly.

Further, the present invention provides a semiconductor manufacturing technology which can create a photographing recipe which enables stable measurement by correcting the photographing recipe based on time-series data even if the shape of the formed pattern changes with time.

According to the semiconductor pattern shape evaluating apparatus and shape evaluating method of the present invention, the semiconductor pattern shape evaluating apparatus using a scanning electron microscope comprises a database which stores CAD pattern design data describing the layout information of a semiconductor pattern, and the diversified data for use in pattern design, data processing means for controlling the diversified data stored in the database integratedly, correlating means which correlates coordinate systems among the diversified data to control the data integratedly with the data processing means, selecting means for selecting part or all of the diversified data arbitrarily from the database, and a creating means for creating a photograph recipe for observing the semiconductor pattern with the scanning electron microscope, wherein the semiconductor pattern shape evaluating apparatus stores the CAD pattern design data describing the layout information of the semiconductor pattern and the diversified data for use in pattern design in the database, controls the diversified data stored in the database with the data processing means integratedly, correlates the coordinate systems among the diversified data with the correlating means to control the data integratedly with the data processing means, selects part or all of the diversified data from the database arbitrarily with the selecting means and creates a photographing recipe for observing the semiconductor pattern with the scanning electron microscope with the creating means.

The effects obtained by typical aspects of the present invention will be briefly described below.

According to the present invention, data conversion corresponding to each process conventionally necessary becomes unnecessary by correlating the coordinate systems of a plurality of data for use in each process for pattern formation, pattern measurement and pattern completeness evaluation and because possessed data are controlled integratedly, data effective for use in each process can be selected easily from the possessed data. As a consequence, semiconductor pattern formation cycle time can be reduced thereby making effective semiconductor manufacturing.

Because, according to the present invention, the diversified data is controlled in time-series fashion, if the shape of a formed pattern changes with time, a photographing recipe, which enables stable measurement, can be created by correcting the photographing recipe based on time-series data.

These and other objects, features and advantages of the invention will be apparent from the following more particular description of preferred embodiment of the invention, as illustrated in the accompanying drawings.

BRIEF DESCRIPTIONS OF THE DRAWINGS

FIG. 1A is a drawing showing an example of system for achieving semiconductor pattern shape evaluating method according to an embodiment of the present invention, specifically, a drawing showing the structure of system containing critical dimension SEM;

FIG. 1B is a diagram showing schematically the state of electrons emitted from the semiconductor wafer;

FIG. 1C is a diagram showing a method for converting the quantity of signals of electron emitted from the semiconductor wafer by irradiation of electron beam into an image;

FIG. 8A is a diagram showing measuring point (danger point) data recording a portion requiring measurement of formed pattern completeness;

FIG. 8B is a diagram showing each template selection index value data computed in template selection processing;

FIG. 8C is a diagram showing selection template data storing the coordinate and size of each template obtained by template selection processing;

FIG. 8D is a diagram showing each template photographing data which stores SEM image obtained following the photographing recipe and photographing condition;

FIG. 8E is a diagram showing measuring point photographing data which stores the SEM image obtained when the EP photographing is carried out, its photographing condition and evaluation data;

FIG. 8F is a diagram showing process condition data which is condition data in each process which forms the pattern;

FIG. 8G is a diagram showing the mask data;

FIG. 8H is a diagram showing measuring unit data which data inherent in a unit for use in measurement;

FIG. 8I is a diagram showing each template success/failure data which stores the coordinate of template which succeeds in positioning to the EP and fails therein;

FIG. 20A is a diagram showing a case where only layout data of a layer is data;

FIG. 20B is a diagram showing a case where multi-layer layout data exists;

FIG. 20C is a diagram showing pattern design data supplied with mask information (removed/remained information);

FIG. 20D shows data supplied with a difference in material of formed pattern using the process condition;

FIG. 20E is a diagram showing data which computes the shape of a pattern formed by the process simulation;

FIG. 20F is a diagram showing simulation result data of the SEM image computed by electron beam simulation based on data computed by the process simulation;

FIG. 22 is a diagram showing GUI for outputted data for monitoring time-series data.

DESCRIPTIONS OF THE PREFERRED EMBODIMENTS

Figure 2:
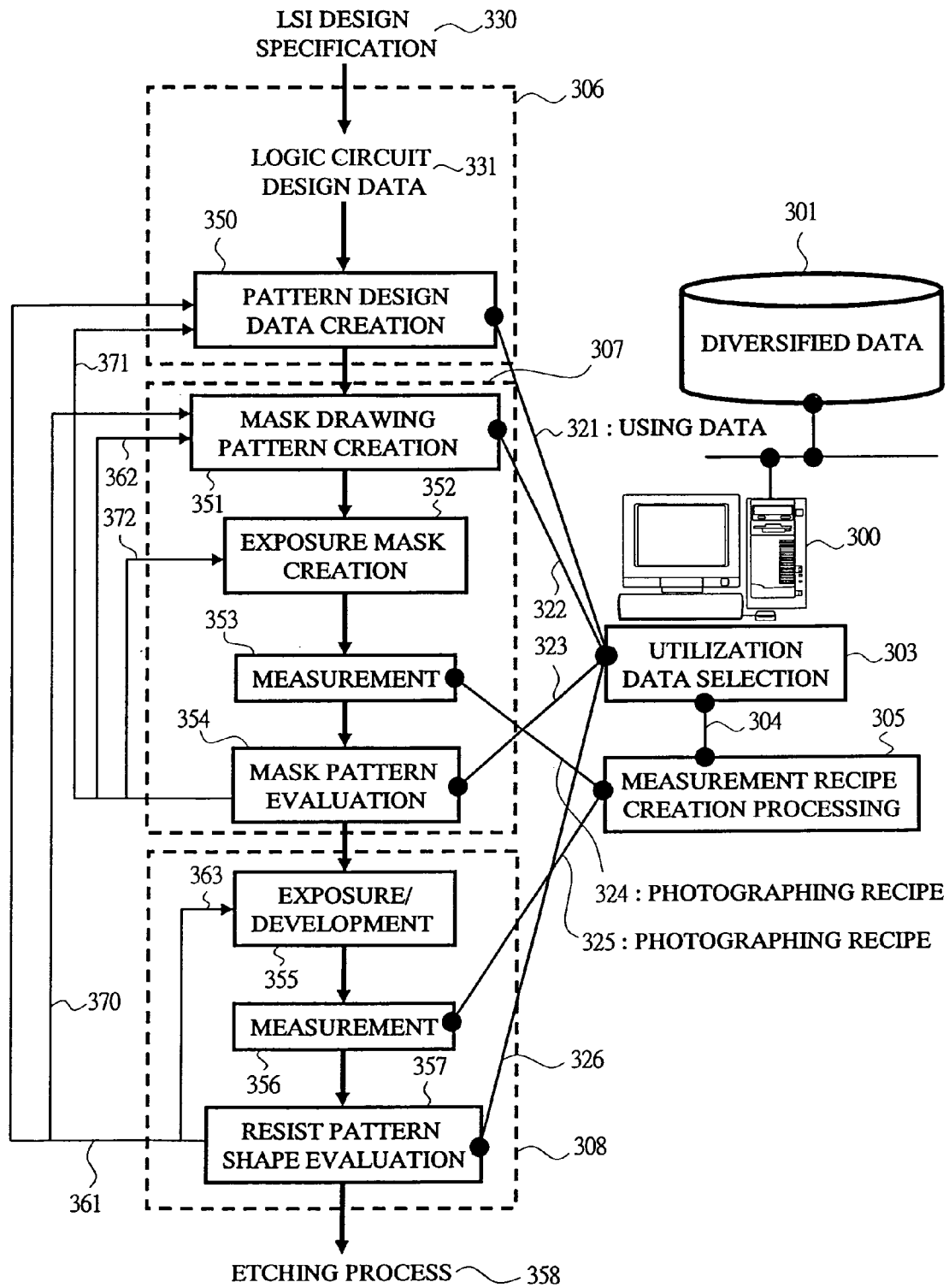
FIG. 2 is a diagram showing processing sequence using various kinds of data.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Although a semiconductor wafer (or abbreviated as just "wafer") in which a pattern is formed will be described as a test sample for shape evaluation object using the critical dimension SEM, the present invention is not restricted to this example.

(Structure of Critical Dimension SEM: FIG. 1)

FIG. 1 is a drawing showing an example of system for achieving the semiconductor pattern shape evaluation method according to an embodiment of the present invention, FIG. 1A is a drawing showing particularly critical dimension SEM in detail, and FIGS. 1B, 1C are diagrams showing a method for converting the quantity of signals of electron emitted from the semiconductor wafer to an image.

The structure of the critical dimension SEM for acquiring secondary electron (SE) image of a test sample or reflected electron (BSE) image will be described with reference to FIG. 1A. Here, the SE image and BSE image are generally called SEM image. The images acquired here include a top down image produced by observing a measurement object from above in the vertical direction or part or all of tilted image produced by observing from an arbitrary inclined direction.

The critical dimension SEM has an electric optical system 102 for irradiating a semiconductor wafer 101 which is a test sample with electron beam. This electric optical system 102 includes an electron gun 103, a condenser lens 105, a polariscope 106, ExB polariscope 107, an objective lens 108, a secondary electron detector 109, reflected electron detectors 110, 111, stage 117 and the like. A/D converters 112-114, a stage controller 119 and polarization control portion 120 are connected to an exterior portion of this electric optical system 102. And additionally, a processing/control portion 115, a display 116, a memory unit 123, a photographing recipe creating portion 125, a display 126, a memory unit 127 and the like are connected also exterior portion of this electric optical system 102.

The electron gun 103 creates electron beam 104. The irradiation position and diaphragm of electron beam are controlled by the polariscope 106 and the objective lens 108 so that electron beam is focused on an arbitrary position on the semiconductor wafer 101 placed on a stage 117. Secondary electron and reflected electron are discharged from the semiconductor wafer irradiated with electron beam and the secondary electron is detected by the secondary electron detector 109. On the other hand, the reflected electron is detected by the reflected electron detectors 110, 111. The reflected electron detectors 110, 111 are installed in different directions to each other. The secondary electron and reflected electron detected by the second electron detector 109 and the reflected electron detectors 110, 111 are converted to digital signals by the A/D converters 112, 113, 114 and stored in the image memory 122 and then, processed in the CPU 121 corresponding to a purpose.

FIGS. 1B and 1C show a method for converting the quantity of signals of electron emitted from the semiconductor wafer to an image when the semiconductor wafer is scanned with electron beam. Electron beam is irradiated by scanning the semiconductor wafer as indicated with 201-203 or 204-206 in the X and Y directions as shown in FIG. 1B. The scanning direction can be changed by changing the direction of polarization of electron beam. Places of the semiconductor wafer irradiated with electron beams 201-203 by scanning in the X direction are indicated with G1-G3. Likewise, places of the semiconductor wafer irradiated with electron beams 204-206 by scanning in the Y direction are indicated with G4-G6. The quantity of signals of electron emitted to the G1-G6 turns to brightness value of pixels H1-H6 in an image 209 as indicated in FIG. 1C (the subscripts 1-6 on the right bottom of G, H correspond to each other). Reference numeral 208 designates coordinate system which indicates the X and Y directions on the image.

Reference numeral 115 in FIG. 1A denotes a processing/control portion constituted of computer system, which sends a control signal to the stage controller 119 and the polarization control 120 in order to photograph AP or FP or SP or EP based on the photographing recipe or executes respective image processing on an observed image of the semiconductor wafer 101. The processing/control portion 115 is connected to the display 116 and includes a graphic user interface (GUI) for displaying an image and the like for user. Reference numeral 117 denotes a XY stage, which moves the semiconductor wafer 101 to enable photographing of an image at an arbitrary position on the semiconductor wafer. Changing the observation position with the stage 117 is called "stage shift" and changing the observation position by polarizing electron beam with the polariscope 106 is called "beam shift".

Although FIG. 1 shows an embodiment having two reflected electron image detectors, the quantity of the reflected electron image detectors can be decreased or increased. Part or all of the processing/control in the computer system of the above-described processing/control portion 115 can be allocated to plural different processing terminals and executed.

As a method for obtaining a tilted image by observing a measurement object from an arbitrary inclined direction using the apparatus shown in FIG. 1, there are available (1) a method of inclining the irradiation angle of electron beam by polarizing electron beam to be irradiated from electron optical system and photographing an inclined image (for example, Japanese Patent Application Laid-Open No. 2000-348658), (2) a method of inclining the stage 117 itself for moving the semiconductor wafer (in FIG. 1, the stage is tilted at a tilt angle 118), and (3) a method of tilting the electron optical system mechanically.

(Flow of Resist Pattern Formation: FIG. 2)

FIG. 2 is a diagram showing a processing sequence using multiple data in a processing in which the multiple data to be controlled integratedly of this embodiment is used in each semiconductor process. The detail of the multiple data will be described later.

A portion surrounded by dotted line indicates respective processes for semiconductor manufacturing up to formation of resist pattern on the wafer and flow of measurement. Major flows of processing are as follows. The detail of each process will be described later. First, pattern design is executed using EDA tool according to LSI design specification (303) (306).

Next, an exposure mask is created based on a designed pattern (307). Then, exposure and development are carried out using the created exposure mask to form a resist pattern on the wafer (308).

In pattern design step (306), gate-level logic circuit design data 331 is created using EDA tool according to the LSI design specification and a cell to be disposed within the LSI and pattern design data which designs arrangement of wire for connecting the cells are created based on the created logic circuit design data 331 (350).

In exposure mask creating step (307), a mask drawing pattern is created using an electron beam drawing simulator according to the pattern design data (351). Next, an exposure mask is created using the electron beam drawing unit according to the created mask drawing pattern (352). The created exposure mask is measured with a mask inspecting unit (353) to evaluate whether the exposure mask is located within the design margin of the mask drawing pattern (354). If it is located within the design margin, the procedure proceeds to exposure/development process (308), which is a next process, and if it is located out of the design margin, the procedure is fed back to the exposure mask pattern design (351) (362) to correct mask design data or the procedure is fed back to creation of exposure mask (352) with the electron beam drawing unit (372) to adjust the unit condition or the procedure is fed back to the pattern design steps (306) (371) to correct the design pattern.

In the exposure/development step (308), exposure and development are executed to resist applied to the wafer based on the exposure mask (355) to form a resist pattern on the wafer. The formed resist pattern is measured by an inspecting unit (356) to evaluate the shape of the resist pattern (357). If the formed resist pattern is out of a design margin, the procedure proceeds to etching process (358), which is a next process. If the formed resist pattern is within the design margin, the procedure is fed back to the exposure/development process (355) to change the process condition (363). Or the procedure is fed back to the exposure mask creating steps (307) (370) to correct the exposure mask. Or the procedure is fed back to the pattern design steps (350) (361) to correct the design pattern. The above-described manufacturing steps are executed to form a desired resist pattern on the wafer according to the LSI design specification finally.

Diversified data (the detail of data will be described later) are used for pattern creation, pattern measurement and pattern evaluation in each process and according to this embodiment, the diversified data for use in each process are controlled integratedly (the detail of the control method will be described later) in database 301 and data for use in each process are selected using data server 300 (303) and sent to each process through a network described later to utilize the diversified data possessed in an effective way. The feature of the control method may be found in a coordinate linkage which relates the coordinates of each data or the like although the detail of the control method will be described later. Particularly, measurement of the pattern requires a measurement recipe for the inspecting unit and in the measurement recipe creation, data for use in the measurement recipe creation is selected from the data server 300 (303) to execute the measurement recipe creation processing (305). The created measurement recipe is sent to each inspecting unit through network to execute measurement of the exposure mask (353) or measurement of the formed resist pattern (356).

As described above, this embodiment enables integral control of diversified data for use in respective steps from the LSI design specification 330 to formation of the resist pattern through each semiconductor manufacturing step and evaluation of the resist pattern shape, sending of utilization data effective for each process through network, effective use of the possessed diversified data and effective utilization of data with the coordinate linkage described later.

Figure 3:
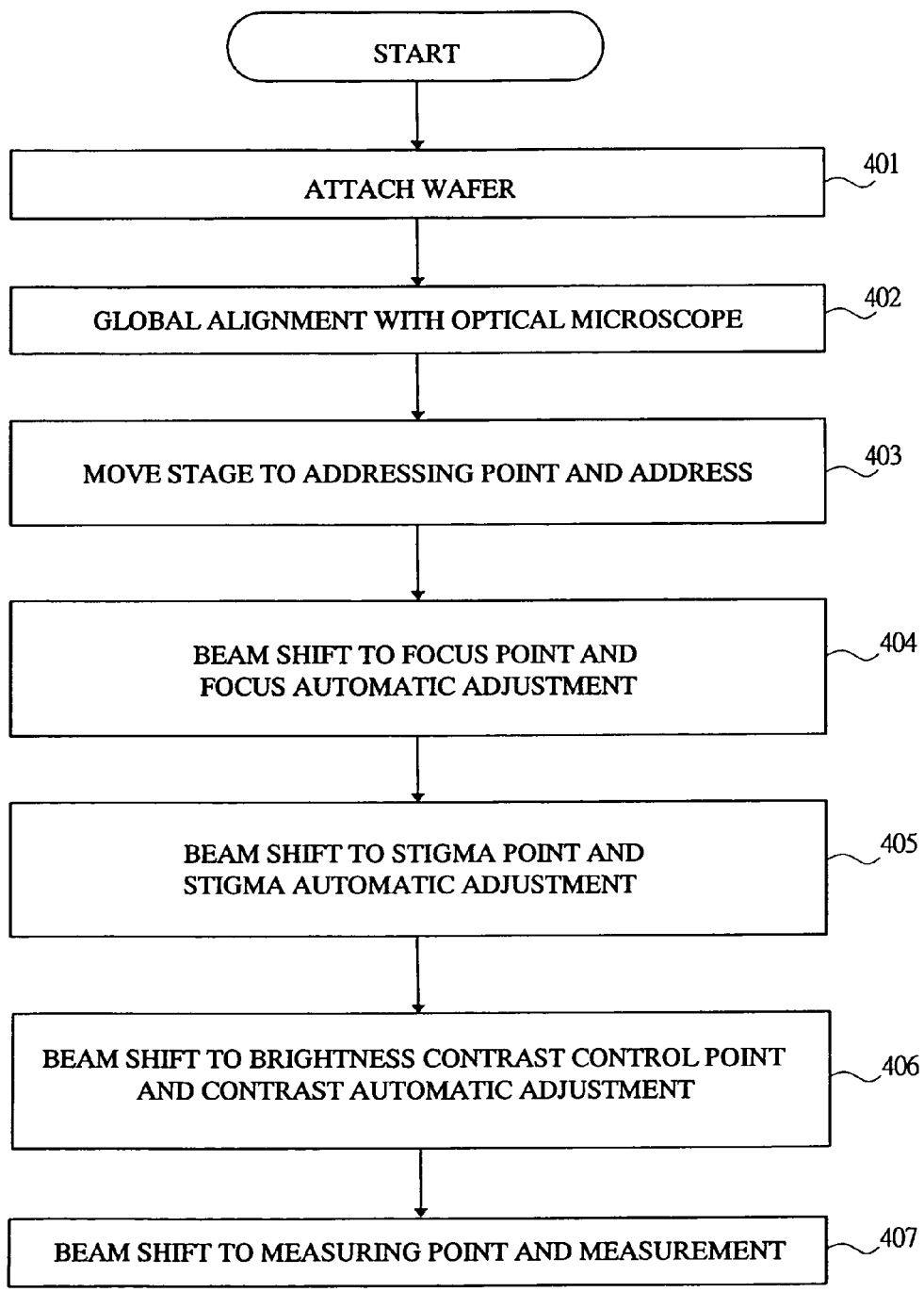
FIG. 3 is a flowchart showing a photographing sequence.

(Photographing Sequence with Critical Dimension SEM: FIG. 3)

FIG. 3 is a flowchart showing a photographing sequence for observing an arbitrary measurement point (hereinafter referred to as "EP") based on the photographing recipe with the critical dimension SEM. In the meantime, photographing position and photographing condition under the aforementioned sequence and photographing condition at the EP are controlled in the database as photographing recipe (301 in FIG. 2).

First, in step 401, a wafer is attached to the stage 117 of the SEM unit. Next, the processing/control portion 115 computes shifts of home position and rotation by observing a global alignment mark on the semiconductor with an optical microscope or the like and corrects the shifts by controlling the stage 117 through the stage controller 119 based on the amount of the deviations. Next, the processing/control portion 115 moves the stage 117 to move a photographing position to an addressing point (hereinafter referred to as "AP") following the coordinate of the photographing point created by a photographing recipe creating portion 125 and photographs under a photographing condition at a lower magnification than at the time of photographing at the EP (step 403). The AP is created by the photographing recipe creating portion 125 as a positioning means in order to solve such a problem that an observation position is shifted for the reason of positioning accuracy or the like of the stage when the EP is observed directly and registered in the memory unit 123. By observing the AP whose coordinate has been already known, the processing/control portion 115 matches a template for the AP which is created by the photographing recipe creating portion 125 and registered in the memory unit 123 with a SEM image of the aforementioned observed AP to detect the vector of a shift between the central coordinate of the image template and a central coordinate when the AP is actually observed.

Next, in step 404, the processing/control portion 115 can photograph the EP at a high coordinate accuracy by shifting the beam (changing the irradiation position by tilting the beam incident direction) by controlling the polariscope 106 through the polarization control portion 120 by an amount obtained by subtracting the detected shift vector from relative vector of the template coordinate and moving the photographing position to observe the EP (generally, the positioning accuracy of the beam shift is higher than the positioning accuracy of the stage). Thus, preferably, the AP created by the photographing recipe creating portion 125 and registered in the memory unit 123 satisfies (1) a pattern existing at a distance in which it can be moved from the EP by the beam shift (and depending on a case, the field of view (FOV) at the time of photographing the EP is not included in a field of view at the time of photographing the AP in order to suppress creation of contamination in the EP), (2) condition that the photographing magnification of the AP is lower than the photographing magnification of the EP taking into account the positioning accuracy of the stage, and (3) condition that the pattern shape or brightness pattern is characteristic (a pattern having a shape or brightness easy to match) and the registered image template and the observed SEM image are easy to match.

Next, auto-focus parameter is obtained by moving the photographing position by beam shift based on control and processing of the processing/control portion 115 to a focus point (FP) and photographing and then auto-focus is carried out based on the obtained parameter. The FP will be further described. Although auto-focus is carried out to acquire a clear image at the time of photographing the EP, contamination adheres to a wafer if electron beam is projected to the wafer 101 for a long period of time. Thus, in order to suppress the adhesion of contamination to the EP, a method in which the processing/control portion 115 observes a coordinate near the EP as the FP to obtain auto-focus parameter and then observes the EP based on that parameter is adopted. For the reason, preferably, the FP registered in the memory unit 123 satisfies (1) a pattern existing at a distance in which it can be moved by beam shift from the AP or EP, (2) condition that the photographing magnification of the FP is substantially equal to the photographing magnification of the EP, and (3) condition that it has a pattern shape which allows auto-focus to be executed easily (blurring of an image due to auto-focus can be detected easily).

Next, the photographing position is moved to a stigma point (hereinafter referred to as SP) by beam shift based on control and processing by the processing/control portion 115 to obtain a parameter for astigmatism correction and automatic astigmatism correction is carried out based on the obtained parameter (step 405). Then, the SP will be explained here. Although astigmatism correction is carried out to obtain an image without distortion at the time of photographing at the EP, contamination adheres to the wafer if electron beam is irradiated to the wafer for a long period of time like the AP. For the reason, a method in which the processing/control portion 115 obtains parameter for astigmatism correction by observing a coordinate near the EP as the SP and then observes the EP based on the parameter is adopted in order to prevent any contamination from adhering to the EP. For the reason, preferably, the SP registered in the memory unit 123 satisfies (1) a pattern existing at a distance in which it can be moved by beam shift from the AP, EP while the FOV at the time of photographing the AP or EP is not included in the FOV at the time of photographing the SP, (2) condition that the photographing magnification of the SP is substantially equal to the photographing magnification of the EP, and (3) condition that it has a pattern shape which is easy to subject to astigmatism correction (blurring of an image due to astigmatism can be detected easily).

Next, the photographing position is moved to brightness & contrast point (hereinafter referred to as BP) based on control and processing of the processing/control portion 115 to photograph it and obtain a parameter for brightness and contrast adjustment and automatic brightness and contrast adjustment is carried out based on the obtained parameter (step 406). The BP will be explained here. In order to obtain a clear image having appropriate brightness and contrast at the time of photographing, parameters such as voltage value of photomultiplier tube in the secondary electron detector 109 are set by adjustment so that for example, the highest portion and the lowest portion of an image signal have a full contrast or equivalent contrast. At this time, contamination adheres to a wafer if electron beam is irradiated to the wafer for a long period of time like the AF.

In order to suppress the adhesion of contamination to the EP, the processing/control portion 115 obtains a parameter for brightness and contrast adjustment by observing a coordinate near the EP as the BP and then observes the EP based on the obtained parameter. For the reason, preferably, the BP registered in the processing/control portion 115 satisfies (1) a pattern existing at a distance in which it can be moved by beam shift from the AP or EP while the FOV at the time of photographing the AP or EP is not included in the FOV at the time of photographing the SP, (2) condition that the photographing magnification of the SP is substantially equal to the photographing magnification of the EP and (3) condition that the BP is of a pattern similar to a pattern at a length measuring point because the brightness and contrast of an image photographed at the length measuring point is favorable using a parameter adjusted at the BP.

In the meantime, the auto focus, auto stigma, auto brightness and contrast of the previously mentioned step 404, step 405 and step 406 vary, for example, part or all of them are omitted or the sequences of step 404, step 405 and step 406 are replaced with each other arbitrarily or some coordinates of the FP, SP, BP overlap (for example, auto focus and auto stigma are executed at the same position).

Finally, the photographing position is moved by beam shift to a length measurement point (EP) based on the control and processing of the processing/control portion 115 and the length measurement of a pattern is carried out under a set length measurement condition to evaluate the shape of semiconductor pattern (step 407).

Figure 4:
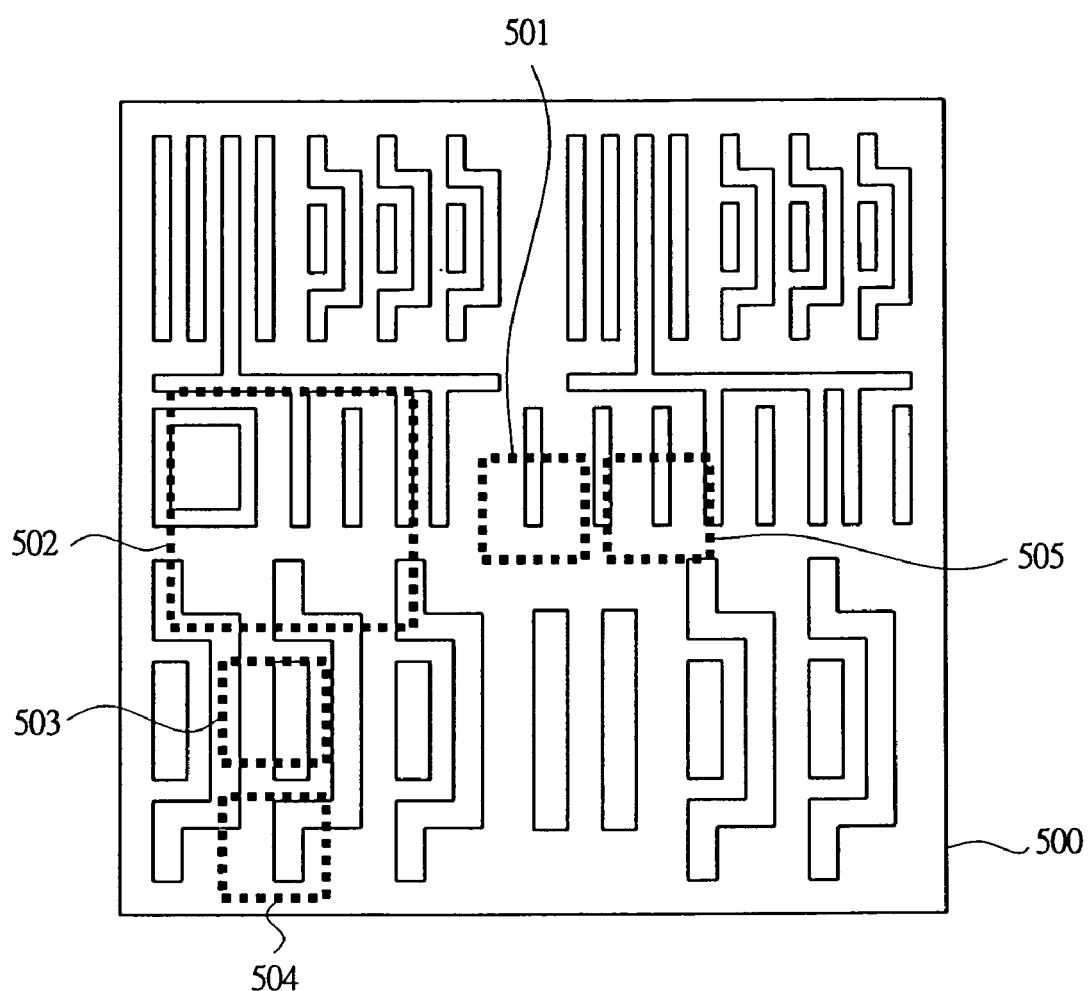
FIG. 4 is a diagram showing an example of each template photographing position at a low magnification.

FIG. 4 represents an example of template photographing positions of AP502, FP503, SP504, BP505 and EP501 on CAD data 500 at a lower magnification than the EP with dotted line frames. The image template for the AP to be registered in the memory unit 123 has variations, for example, CAD image or SEM image or registering a CAD template temporarily in order to avoid photographing only for registration of the template and re-registering its SEM image of AP obtained at the time of actual photographing as the image template, as disclosed in Japanese Patent Application Laid-Open No. 2002-328015.

(System Configuration: FIG. 5)

Figure 5A:
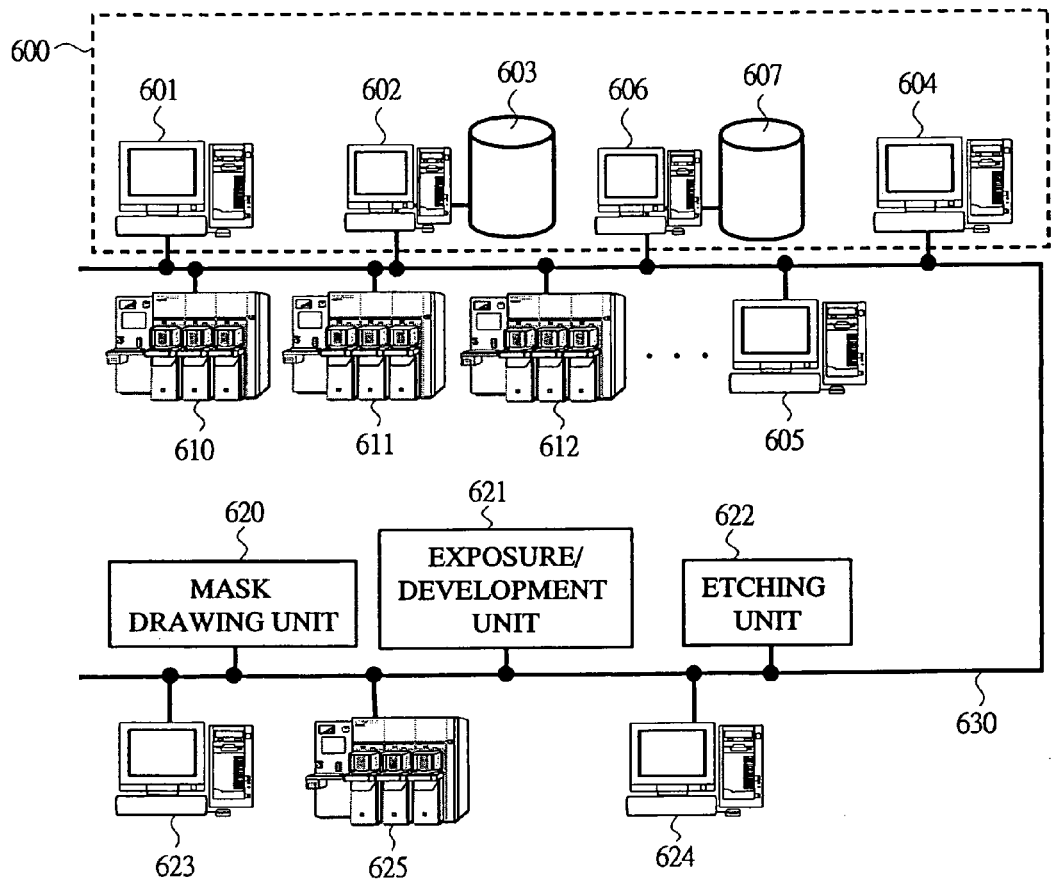
FIG. 5A is a drawing showing an example of system configuration for achieving the semiconductor pattern shape evaluation method.

FIG. 5A is a drawing showing an example of the system configuration for achieving the semiconductor pattern shape evaluation method of this embodiment. Part or all of units described next are connected through network 630. The units to be connected to the network include a length measurement recipe creating unit 601 for creating a photographing recipe of the inspecting unit, a data control server 602 for controlling diversified data described later, a database 603 for storing the diversified data, a pattern shape evaluating unit 604 for evaluating a created pattern, a process simulator and electron beam drawing simulator 605, a plurality of units for observing formed resist pattern, critical dimension SEMs 610, 611, 612, a EDA tool 623 for the aforementioned pattern design, a mask drawing unit 620 for creating an exposure mask, an exposure/development unit 621 for creating a pattern on resist based on the exposure mask, an etching unit 622 for etching based on resist pattern formed on wafer, a mask pattern design unit 624 for designing a mask pattern from the aforementioned pattern design data, and part or all of mask inspecting units 625 for measuring formed exposure masks. According to the present invention, by connecting all the units through network 630, data for use in each process can be selected from the diversified data described later stored in the database 603 and controlled by the data control server 602 and sent to an appropriate unit. The diversified data are stored with the coordinate systems matched between data.

Figure 5B:
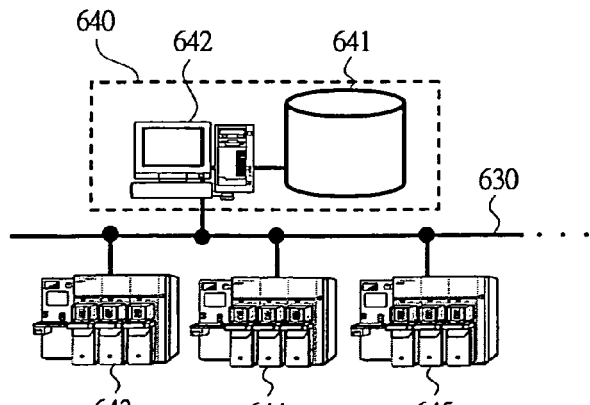
FIG. 5B is a drawing showing another example of system configuration for achieving the semiconductor pattern shape evaluation method.

FIG. 5B is a drawing showing the second example of the system configuration. In this configuration, the length measurement recipe creating unit 601, the data control server 602, the database 603 and the pattern shape evaluating unit 604, which are four components surrounded with the dotted line in the FIG. 5A, are loaded on a single construction and this construction is connected to the network 630 as a formed pattern evaluating unit 640. Like the FIG. 5A, the critical dimension SEMs 643, 644, 645, and part or all of EDA tool 623 (not shown), mask drawing unit 620, exposure/development unit 621, etching unit 622, mask pattern design unit 624 and mask inspecting unit 625 are connected through network. By gathering plural functions into a single construction, the construction is formed in a single unit, thereby simplifying the installation and maintenance of the construction. By sharing diversified data among plural critical dimension SEMs connected to the network, the quantity of held data can be reduced as compared to a case of holding data in each unit and procedure such as creating the photographing recipe for each unit is reduced, thereby intensifying the efficiency of the photographing recipe creation. Further, because the diversified data are controlled integratedly as described later, the frequency in which data whose creation route is unclear is produced is reduced.

Figure 5C:
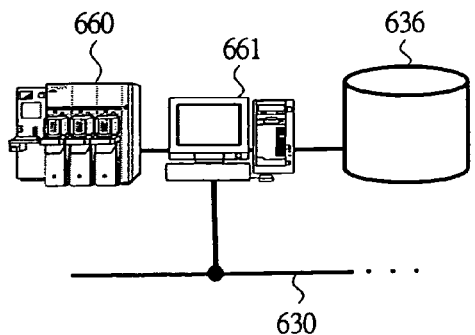
FIG. 5C is a drawing showing still another example of system configuration for achieving the semiconductor pattern shape evaluation method.

FIG. 5C is a drawing showing the third example of the system configuration. According to this configuration example, the length measurement recipe creating unit 601, the data control server 602, the database 603 and the pattern shape evaluating unit 604, which are four components surrounded with dotted line in the FIG. 5A, are loaded on the critical dimension SEM 660. The system is configured by connecting the critical dimension SEM having this function to the network 630. Like the FIG. 5B, part or all of the critical dimension SEMs 643, 644, 645, the EDA tool 623, the mask drawing unit 620, the exposure/development unit 621, the etching unit 622, the mask pattern design unit 624, and the mask inspecting unit 625 (not shown) are connected through the network 630. As a result, the functions such as for photographing recipe creation are loaded on the critical dimension SEM, thereby simplifying the installation, operation and maintenance of the unit.

(Diversified Data: FIGS. 6-8)

The diversified data includes part or all of logic circuit design data, pattern design data describing arrangement information of pattern in a semiconductor chip, process simulation result data, electron beam drawing pattern design data for use in drawing a pattern on exposure mask, electron beam mask drawing simulation result data, pattern design data subjected to optical proximity correction, measurement data about pattern on exposure mask, measurement data about formed resist pattern, measurement data about formed etching pattern, measurement condition data of each measuring unit, process parameter data, condition data of each measuring unit, resist pattern evaluation result data, and measurement recipe of each measuring unit, which will be described in detail later.

(Diversified Data Between Processes: FIG. 6)

FIGS. 6A to H are drawings showing an example of the diversified data for the integral control. 800 to 807 are drawings which show an example of typical data for use in each process of exposure mask design. Respective data of 800-807 will be described simply and the detail of each data and data control method will be described later.

Figure 6A:
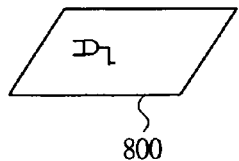
FIG. 6A is a drawing showing logic circuit design data as an example of multiple data (multiple data between processes) for integrated control.

The logic circuit design data 800 of FIG. 6A indicates data describing a logic circuit which achieves a desired operation on an initial stage of exposure mask design, designed by an engineer. This data is composed of gate-level logic circuit.

Figure 6B:
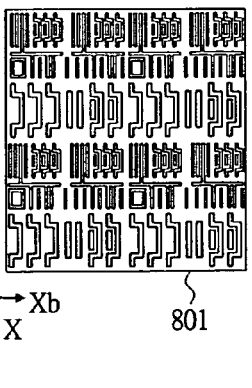
FIG. 6B is a drawing showing pattern design data as an example of multiple data to be controlled integratedly.

The pattern design data 801 of FIG. 6B is data for disposing cells constituting a gate-level logic circuit in LSI chip while interconnecting them using a EDA tool.

Figure 6C:
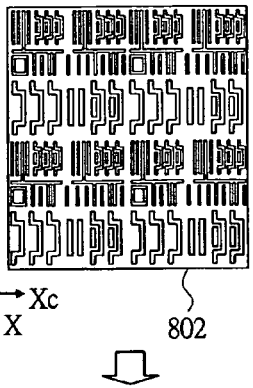
FIG. 6C is a drawing showing post-OPC data as an example of multiple data to be controlled integratedly.

The post-OPC data of FIG. 6C is data which adds a correction pattern to the pattern design data 801 taking into account the optical proximity effect by using OPC design tool.

Figure 6F:
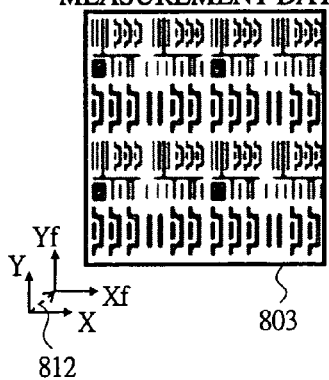
FIG. 6F is a drawing showing actual pattern design data as an example of multiple data to be controlled integratedly.
Figure 6E:
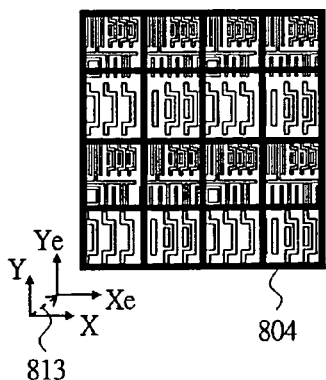
FIG. 6E is a drawing showing actual mask measurement data as an example of multiple data to be controlled integratedly.
Figure 6D:
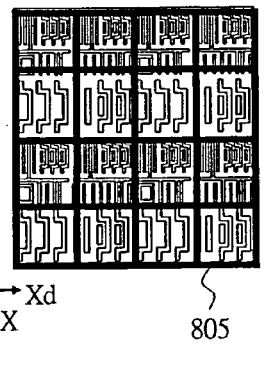
FIG. 6D is a drawing showing mask design data as an example of multiple data to be controlled integratedly.

The mask design data 805 of FIG. 6D is design data for electron beam drawing of a mask pattern, which is data for creating patterns by dividing the post-OPC data 802 to a size capable of being controlled by a drawing unit and taking into account influences of electron beam drawing such as electronic proximity effect.

The actual mask measurement data 804 of FIG. 6E is data about measurement of part or all of a mask created by the electron beam drawing unit based on the mask design data 805, the measurement being carried out by the mask detecting unit. As an example of the mask inspecting unit, optical inspecting unit and mask CD-SEM (mask detection critical dimension SEM) and the like are available.

The actual pattern measurement data 803 of FIG. 6F is data showing a result of measuring part or all of a pattern formed on wafer with the critical dimension SEM by using a created mask and exposure/development unit.

Figure 6G:
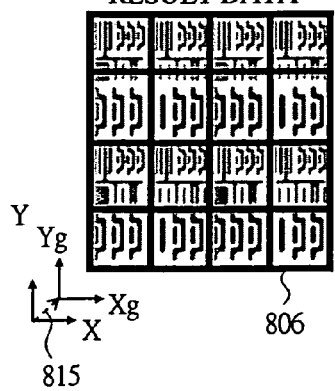
FIG. 6G is a drawing showing electron beam drawing simulation result data as an example of multiple data to be controlled integratedly.

The electron beam drawing simulation result data 806 of FIG. 6G is a result of computation of influences such as electronic proximity effect in electron beam drawing when the mask design data 805 is created. This data can be used as data for use in positioning a mask inspecting unit up to a measurement point as described later.

Figure 6H:
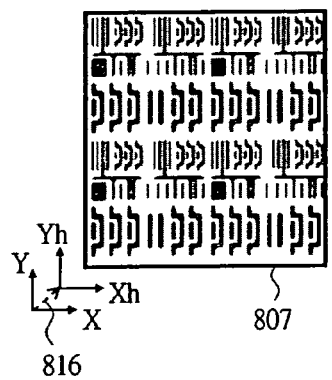
FIG. 6H is a drawing showing process simulation result data as an example of multiple data to be controlled integratedly.

The process simulation result data 807 of FIG. 6H is a result data of computing a pattern formed on the wafer through exposure/development process by process simulation using the mask design data 805, process condition and the like. This data can be used as data for positioning the CD-SEM up to a measurement point.

Each data 800-807 shown in FIGS. 6A-H has data structure which allows corresponding points between those data to be referred to easily. As an example of the data structure, as described in detail later, for example, a method for storing each data by converting the coordinate system of each data into the same coordinate system and a method of holding a conversion table for converting the coordinate system of each data into the same coordinate system and executing coordinate conversion using the same conversion table are available. Having such data structure correlates the coordinates of respective data (hereinafter this is called "coordinate linkage") and eliminates necessity of searching for the position of a pattern to be referred to in each data when each data is referred to and a desired pattern can be referred to only by specifying the coordinate.

(Template Data: FIG. 7)

FIG. 7 is a drawing showing an example of the diversified data which executes the integral control. 900 to 906 show an embodiment which holds data for use in a photographing recipe for measuring a resist pattern formed in the exposure process. Each data of 900-906 will be described simply and the detail of each data and data control method will be described later.

Figure 7A:
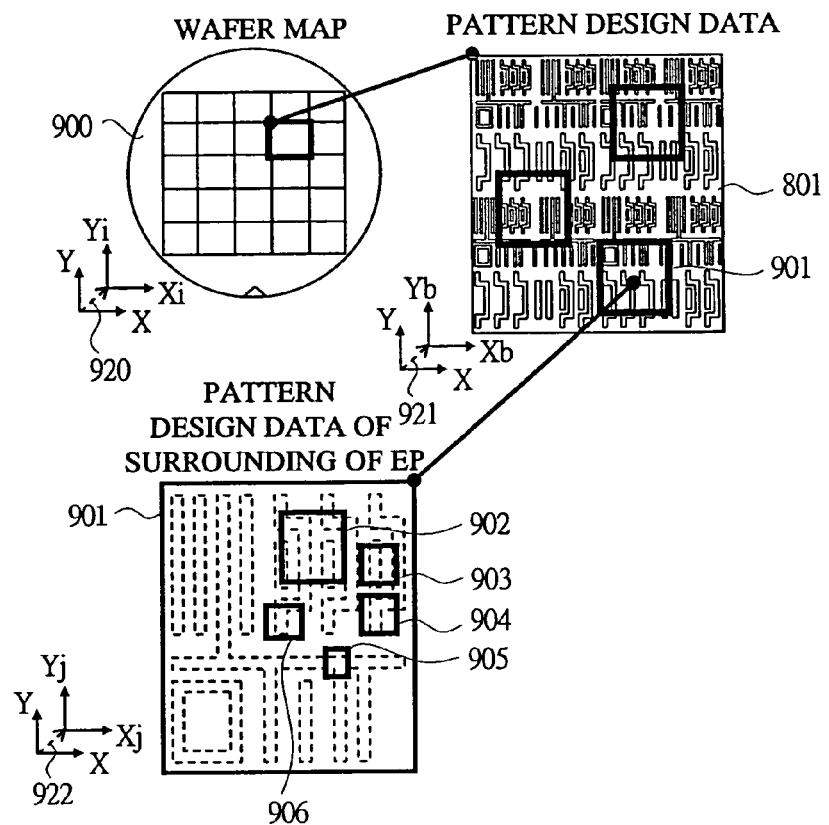
FIG. 7A is a diagram for explaining pattern design data.

FIG. 7A is a diagram for explaining pattern design data and wafer map 900 is data indicating chip coordinate on a wafer. This data stores information about arrangement of chips designed on the wafer. For example, this figure shows that chips are arranged on the wafer longitudinally by five and laterally by five in a square form for the reason of simplicity, as a data structure which allows the position of a target chip on the wafer to be referred to.

Pattern design data 901 around the EP is data which cuts out the template search area around the EP in the pattern design data 801. As pattern design data for use in searching for a template for recipe creation, nothing but this pattern design data 901 around the EP is required. Because all pattern design data is too large in its data volume, storing only the pattern design data 901 around the EP, which is indispensable for creation of a recipe, can reduce the amount of data to be exchanged between units largely.

Figure 7B:
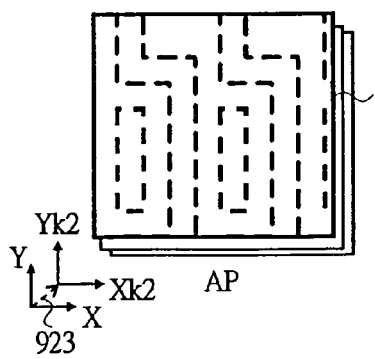
FIG. 7B is a diagram showing a addressing point (AP) as an example of template data for integrated control.
Figure 7C:
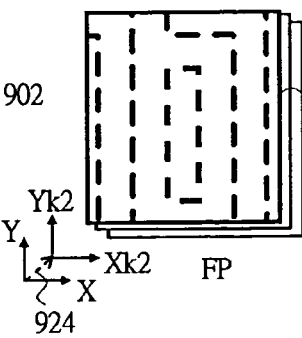
FIG. 7C is a diagram showing focusing point (FP) as an example of template data for the integrated control.
Figure 7D:
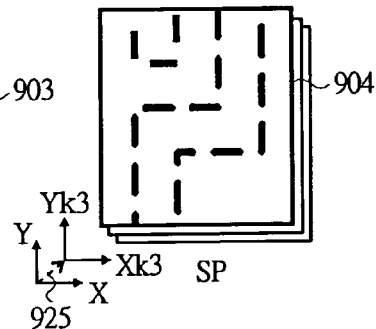
FIG. 7D is a diagram showing stigma point (SP) as an example of template data for the integrated control.
Figure 7E:
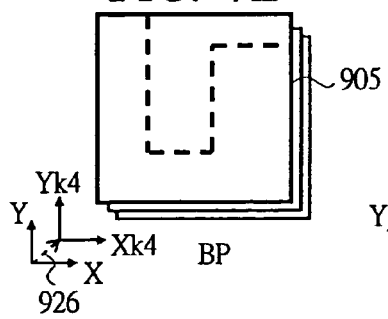
FIG. 7E is a diagram showing brightness and contrast point (BP) as an example of template data for the integrated control.
Figure 7F:
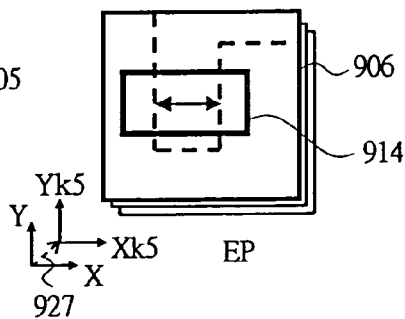
FIG. 7F is a diagram showing a measurement point (EP) as an example of template data for the integrated control.

The template data is data which stores AP 902 of FIG. 7B containing photographing recipe, FP 903 of FIG. 7C, SP 904 of FIG. 7D, BP 905 of FIG. 7E and EP 906 of FIG. 7F. Each template data is obtained by for example, the aforementioned template selection processing. At the time of measurement using the photographing recipe, the pattern design data 801 and pattern design data 901 about the surrounding of the EP are not always necessary as pattern layout data but nothing but the pattern design data of each template is required. Because all the pattern design data or the design data about the surrounding of the EP is large in the data volume, the amount of data to be exchanged between units can be reduced by storing only the template data (AP, FP, SP, BP, EP) necessary for photographing using the recipe.

The template data is stored as polygon data which stores the vertex coordinate of a pattern or image data obtained by converting the polygon data to an image. Each data of 900-906 has a data structure which allows corresponding points between respective data to be referred to easily. As an example of the data structure, as described in detail later, for example, a method for storing each data by converting the coordinate system of each data into the same coordinate system and a method of holding a conversion table for converting the coordinate system of each data into the same coordinate system and executing coordinate conversion using the same conversion table are available. Having such data structure enables the coordinate linkage of each data and eliminates necessity of searching for the position of a pattern to be referred to in each data when each data is referred to and a desired pattern can be referred to only by specifying the coordinate.

(Diversified Data for Recipe Creation Processing: FIG. 8)

FIGS. 8A-I are drawings showing an example of diversified data for the integral control. 1000-1008 indicate an example of method for holding data for use in the recipe creation processing. Each data of 1000-1008 will be described simply and the detail of each data and data control method will be described later.

Measuring point (dangerous portion) data 1000 in FIG. 8A indicates data which records a place 1030 where completeness of a formed pattern needs to be measured when the design pattern is formed on the wafer. This data is about a place computed using process simulation when the pattern design data 801 or the post-OPC data 802 is created using the EDA tool and if the completeness of the pattern shape at that place is out of a design margin, there is a possibility that a fault fatal to the operation of a chip may be induced. This measuring point 1030 is called "hot spot".

Each template selective index value data 1001 in FIG. 8B is data computed by the template selection processing. Each template described later is selected using this index value map.

The selection template data 1002 of FIG. 8C is data which stores the coordinate and size of each template (part or all templates of AP, FP, SP, BP and EP) obtained by the template selection processing.

Each template photograph data 1003 of FIG. 8D is data which stores the SEM image obtained when the AP, FP, SP, BP are photographed following the photographing recipe and photograph condition at the time of measurement. Although described in detail later, this data can be fed back to template data selection processing for creation of next photographing recipe and if addressing to a measurement point is unstable, a stable photographing recipe may be created by changing the selection template to the SEM image of this data.

The measuring point photograph data 1004 of FIG. 8E is data which stores the SEM image obtained when the EP is photographed, photograph condition at the time of that measurement and evaluation data 1030. The measurement data is data of a result of measurement following measurement items set by the EP in order to evaluate optical proximity correction. Examples of the evaluation data include line width, hole diameter, amount of retraction of line end, open/short determination result and the like.

The process condition data 1005 of FIG. 8F stores condition data of each process which forms the pattern. For example, the exposure process includes illumination condition, resist material information, mask material and exposure time. By computing a range in which the shape of a formed pattern changes due to a process change, with this data, the template can be selected by considering the range of the shape change of each process when the template for creating the recipe is selected. For example, a pattern formed relatively stably in which the amount of change in line width is small and the amount of retraction of the line end is small to the process change is selected as the template of mask data 1006 in FIG. 8G with preference.

The measuring unit data 1007 of FIG. 8H stores data inherent in a unit for use in measurement. This data includes, for example, stage shift accuracy and beam shift accuracy in the case of the critical dimension SEM. Further, measured image aberration map 1010, measured image distortion map 1011 and the like are also stored. Offset of measurement shift amount may be added to each measuring unit or distortion of a measured image may be corrected under a condition inherent in the unit using this data.

Each template success/failure data 1008 in FIG. 8I is data which stores the coordinates and sizes of a template in which positioning to the EP (hereinafter called addressing) succeeds and a template in which it fails in previous measurements. Using this data enables selection of the template which leads addressing to a failure when creating the photographing recipe to be avoided.

Each data of 1000-1008 shown in FIGS. 8A-I has a data structure which allows corresponding points between respective data to be referred to easily like the above 800-807. As an example of the data structure, as described in detail later, for example, a method for storing each data by converting the coordinate system of each data into the same coordinate system and a method of holding a conversion table for converting the coordinate system of each data into the same coordinate system and executing coordinate conversion using the same conversion table are available. Having such data structure enables the coordinate linkage of each data and eliminates necessity of searching for the position of a pattern to be referred to in each data when each data is referred to and a desired pattern can be referred to only by specifying the coordinate.

(Coordinate Linkage, Data Structure: FIG. 9)

Figure 9A:
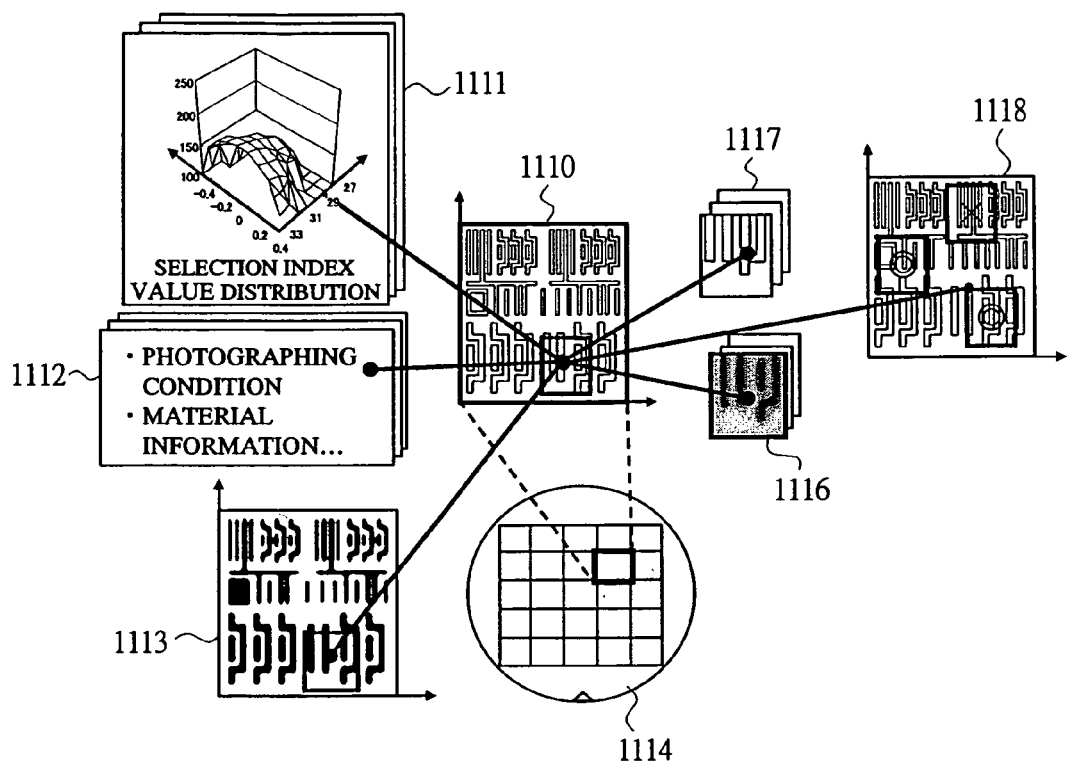
FIG. 9A is a diagram for explaining the outline of the coordinate linkage of the diversified data, and a diagram showing an example of the integrated control method of the diversified data.

FIG. 9 is a diagram for explaining the outline of the coordinate linkage of diversified data, and FIG. 9A is a diagram showing an example of the integral control method of the diversified data. Each coordinate system of the diversified data keeps linkage with the coordinate system to correlate the coordinate system (coordinate linkage). FIG. 9A is also a diagram for explaining the outline of the coordinate linkage. The detail of the data structure will be described later. Some of the diversified data has the coordinate system and those coordinate systems are expressed with a certain uniform coordinate system as shown in FIG. 9A. For example, this diagram correlates the coordinate system of the diversified data to the coordinate system of the pattern design data 1110. In this way, all or part of the diversified data exemplified in FIGS. 6-8 such as the coordinate system of a template selection index value distribution 1111 for use in creation of photographing recipe, the coordinate system of process simulation result data 1113, the coordinate system of a template 1117, the coordinate system of a resist pattern SEM image 1116, the coordinate systems of the photograph condition and material information 1112 are correlated and stored in the database.

Because the coordinate linkage is executed in this way to secure matching between respective data, a following effect occurs. (1) By securing matching of the respective coordinate systems between the diversified data to be transferred to each step, coordinate conversion or search processing does not need to be carried out when referring to an area between data and referring to the area between data can be executed only by specifying a coordinate, so that effective data processing can be carried out in the above respective steps. (2) The diversified data can be displayed in an overlay state on the GUI easily because the matching of the coordinates is secured.

Figure 9B:
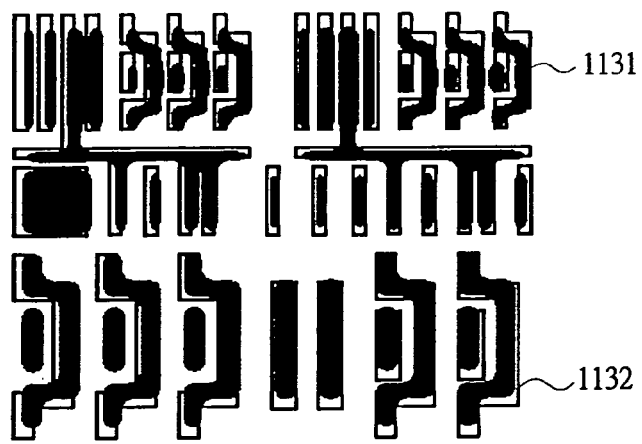
FIG. 9B is a diagram showing an example of overlay display.

FIG. 9B is a diagram showing an example of the overlay display, in which the SEM image 1313 of a resist pattern and pattern design data 1132 are displayed in a superposed (overlaid) state. Further, coordinate 1114 on the wafer of chip, which is a measuring object, can be displayed together. As a consequence, on which coordinate of other diversified data, for example, pattern design data the SEM image obtained by measurement using the critical dimension SEM exists can be referred to easily, so that verification of a measurement result can be executed by tracing back all steps of the semiconductor manufacturing process which share data.

Figure 10:
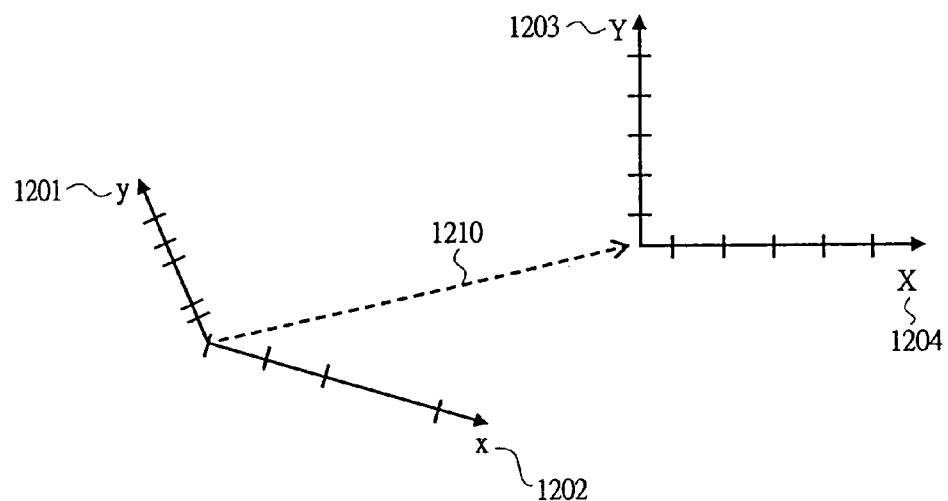
FIG. 10 is a diagram showing a method for converting each coordinate system of the diversified data.

(Coordinate Conversion: FIG. 10)

FIG. 10 is a diagram showing a method for converting respective coordinate systems of the diversified data. The coordinate systems of the diversified data are different among respective data and x-axis 1201 and y-axis 1201 do not intersect at right angle depending on data or sometimes the scale in the x-axis direction and the scale in the y-axis direction are not equal. The respective data need to be converted to an equal coordinate system in order to carry out the coordinate linkage. For example, if the coordinate system of certain data is x-axis 1201 and y-axis 1201, which do not intersect at right angle while the scales of the respective axis directions are not equal, by executing conversion processing 1210 such as displacing, rotation or mapping conversion at the aforementioned coordinate system, the coordinate system can be converted to such a coordinate system in which the X-axis 1204 and Y-axis 1203 intersect at right angle and the scales of the respective axes are equal while the home positions of the respective data are unified. In FIG. 6 indicating the diversified data, 810 to 816 show schematically the aforementioned coordinate conversion and in FIG. 7, 920-927 show schematically the coordinate conversion and in FIG. 8, 1020-1027 show schematically the coordinate conversion.

(Example of Data for Use in Each Step)

Here an example of use of the diversified data in the semiconductor manufacturing process of the present invention will be described. The diversified data is used in each step (FIG. 2) shown as follows.

(1) Among the diversified data, the post-OPC pattern data 802 is used in the mask design data creation step (351). Further, mask design data including the characteristic of electron beam drawing and the characteristic of the mask drawing unit can be created using the electron beam drawing simulation result data 806 or old actual mask measurement data 804 or mask drawing unit information (measuring unit data) 1007, so that a higher accuracy exposure mask design is enabled.

(2) In creation of the measurement photographing recipe for the exposure mask (353), the mask inspecting unit photographing recipe 305 is created using the mask design data 805 and measuring point data. Further, if the electron beam drawing simulation result data 806 is used, a photographing recipe, which enables a more stable mask measurement, can be created because a template pattern for photographing recipe, which is similar to an actually formed mask pattern, is obtained.

(3) In creation of the photographing recipe (305) for resist pattern measurement, the photographing recipe is created using the pattern design data 801 and measuring point data 1000 of the diversified data. Further, a photographing recipe which enables a more stable measurement can be created using all or part of the old respective template photograph data 1003, the measuring unit data 1007, the process simulation result data 807 and respective template success/failure data 1008 of the diversified data.

(4) In the resist pattern shape evaluating step (357), completeness of a formed pattern is evaluated using the measuring point photograph data 1004 and pattern design data 801 of the diversified data.

Figure 11:
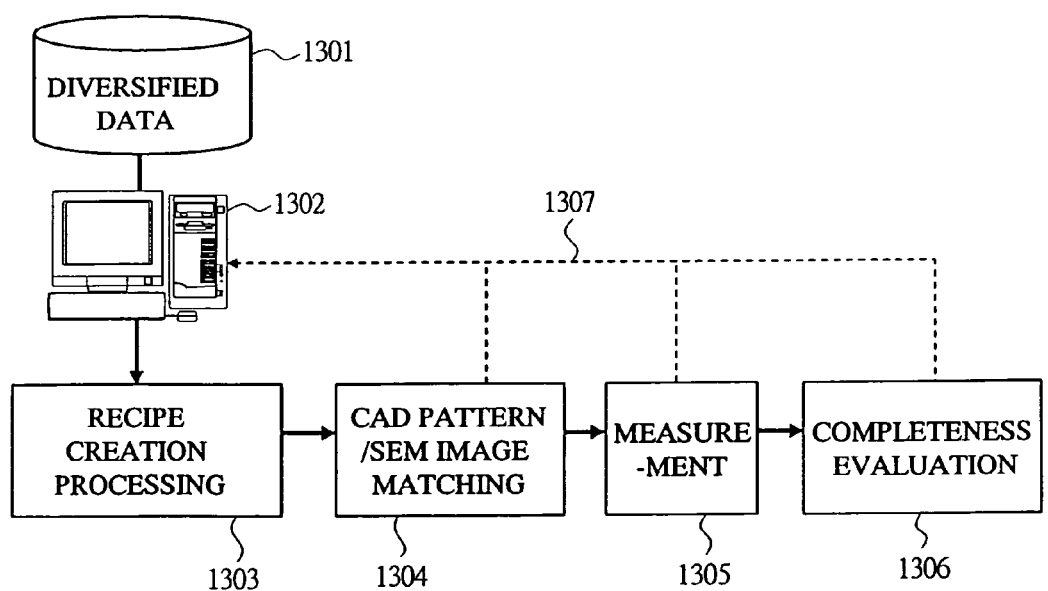
FIG. 11 is a diagram showing an example of photographing recipe creation method using data stored in time-series fashion.

(Time Series Data: FIG. 11)

FIG. 11 is a diagram showing an example of photographing recipe creation method using data stored in time series fashion (hereinafter called "time-series data") of this embodiment. This example indicates a flow of processing for photographing recipe creation using the time-series data.

If a flow of processing will be described simply, the above-described data for use is selected from the diversified data stored in the database 1301 through the data control server 1302 and then, a photographing recipe for measurement is created by recipe creation processing (1303). Addressing and measurement (1305) are carried out by CAD pattern-SEM image matching (1304) with the critical dimension SEM based on the aforementioned recipe to evaluate completeness of pattern based on pattern measurement data (1306). To control the time-series data, measuring point photograph data 1004 obtained by measurement of the resist pattern (1305) with the aforementioned critical dimension SEM, shift amount of addressing obtained by the CAD pattern-SEM image matching (1304) described later, or completeness evaluation data obtained by completeness evaluation (1306) are transferred to the data control server 1302 (1307) and stored in the database 1301 which stores the diversified data by matching with the stored other diversified data. By controlling the obtained data in time-series fashion, the time-series data can be used in the photographing recipe creation processing (1303).

(Shift Amount of Addressing: FIG. 12)

Figure 12A:
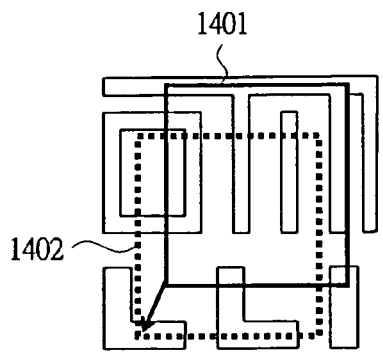
FIG. 12A is a diagram showing the shift amount of addressing.
Figure 12B:
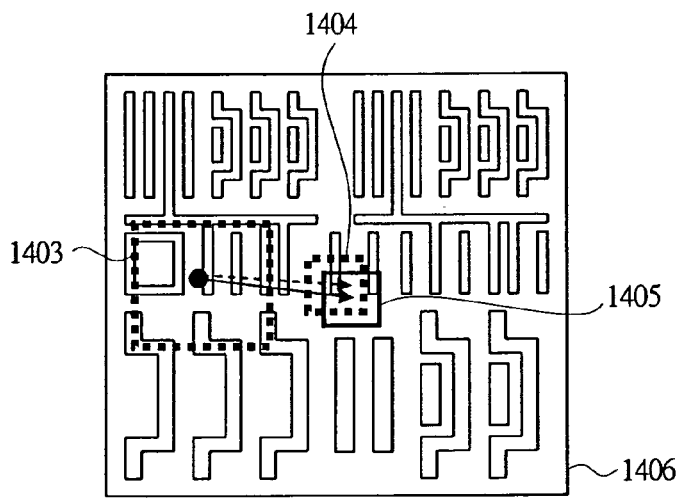
FIG. 12B shows template data showing the state in which a change in of beam shift amount of the measuring SEM occurs.
Figure 12C:
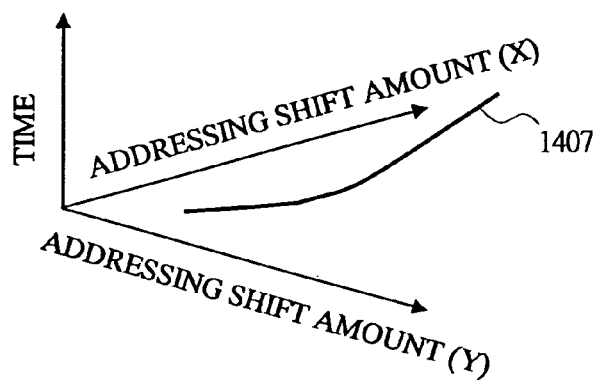
FIG. 12C is a graph showing changes in addressing shift amount with time in the X direction and Y direction.

FIGS. 12A-C are drawings showing an example of photographing recipe creation using the time-series data obtained by storing the shift amount of addressing in the time-series fashion. FIG. 12A is a drawing showing the shift amount of addressing, FIG. 12B is template data showing a state in which a change occurs in the beam shift amount of the critical dimension SEM, and FIG. 12C is a graph showing a change in time-series fashion of the shift amount of addressing in the X-direction and Y-direction.

The addressing shift amount described later, which is computed by CAD pattern-SEM image matching (1304) in measurement with the critical dimension SEM, can be monitored about its change by being stored in time-series fashion (1407). The addressing shift amount means the amount of beam shift for positioning, which occurs when the CAD pattern is matched with the SEM image after the field of vision of the critical dimension SEM is moved to a registered template coordinate. As regards this beam shift amount, if a template object pattern changes in shape with change in process condition with time so that the addressing position 1402 is shifted from the addressing coordinate 1401 estimated originally on the pattern in the CAD pattern-SEM image matching or if the beam shift amount of the critical dimension SEM changes due to change in detecting unit condition with time (1404, 1405), the addressing shift amounts increase.

By monitoring the addressing shift amount, information of template (template coordinate/size information) in which the addressing shift amount increases is fed back to the photographing recipe creation before the shift amount goes out of an allowable range, to change a template registered in the photographing recipe and correct the photographing recipe, and then, the measurement is continued based on the corrected photographing recipe or a possibility that the formed pattern may deviate from a desired pattern shape due to a process change or the like is noticed as a warning to urge user to meet this. Alternatively, a possibility that the beam shift amount of the critical dimension SEM may deviate largely is noticed as a warning to urge user to adjust the beam shift.

(Utilization of SEM Image: FIG. 13)

Figure 13A:
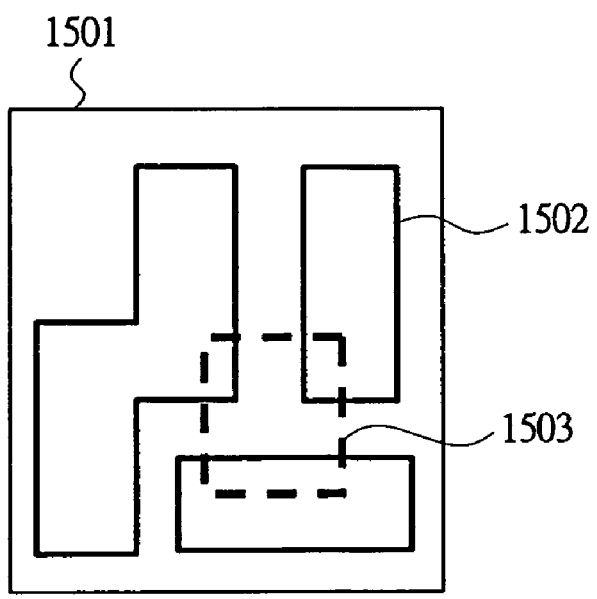
FIG. 13A is a diagram showing a template registered in the photographing recipe.
Figure 13B:
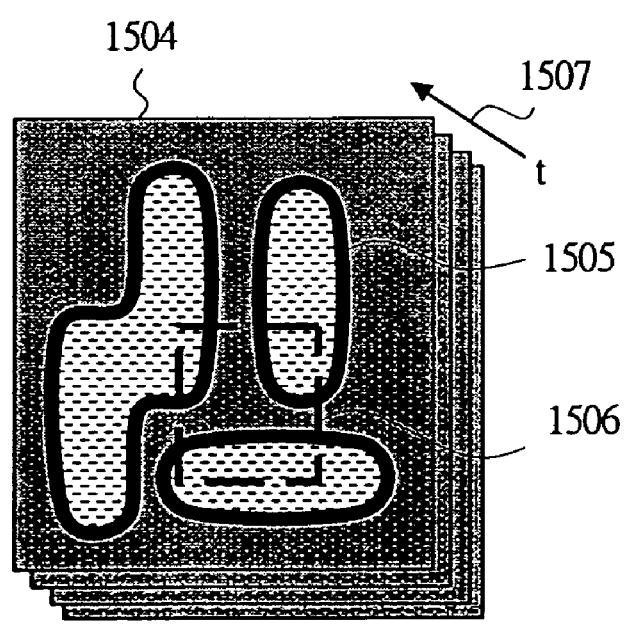
FIG. 13B is a diagram showing time series data, which the SEM image registered in the photographing recipe, is stored in time series fashion.

FIGS. 13A and B are drawings showing an example of the photographing recipe creation using the time-series data which stores the SEM image in time-series fashion. This example is characterized in storing the SEM image 1504 obtained actually with the critical dimension SEM based on the template 1501 registered in the photographing recipe in the diversified data as time-series data. The SEM image 1504 of the stored template pattern is stored as a template of the photographing recipe and in a next measurement, the SEM image 1504 is registered in the photographing recipe as a template instead of the aforementioned template 1501 and the measurement is carried out. In a further next measurement, the SEM image obtained at the time of measurement is registered as a template for next measurement. In this way, the SEM image of the template pattern is stored (1507) in time-series fashion to update the template of the photographing recipe as required. As a consequence, even if a formed pattern shape changes according to the process condition or due to changes in unit status with time, the template follows up the change in shape, to enable addressing up to a stable measuring point against changes in pattern with time. Consequently, photographing recipe capable of photographing in a stable condition against changes in formed pattern with time can be created.

(Example of Data Structure: FIG. 14-FIG. 17)

(Purpose)

Data for use corresponding to a processing purpose can be selected by arbitrary combination by controlling arbitrary diversified data stored in the database as described next. Data for use in each processing may be selected by user arbitrarily using the GUI described later. Data necessary in each processing is stored preliminarily and if selected data is short with respect to the data necessary for a processing, user is notified that the selected data is insufficient through an alarm and urged to meet the situation. For example, if the photographing recipe is created, data necessary for creating the recipe is pattern design data 801 and measuring point data 1000, and unless these data are selected, this is notified to user through an alarm.

To improve photographing stability by the creation recipe, arbitrary diversified data stored in the database may be selected as other data. For example, if old template photograph data 1003, measuring unit data 1007 or process simulation result data 8007 is stored in the database, these can be selected and a recipe is created using these data. At this time, matching among data is secured because the diversified data are controlled as described later, so that the respective data can be selected easily and referred to through the GUI.

Figure 14:
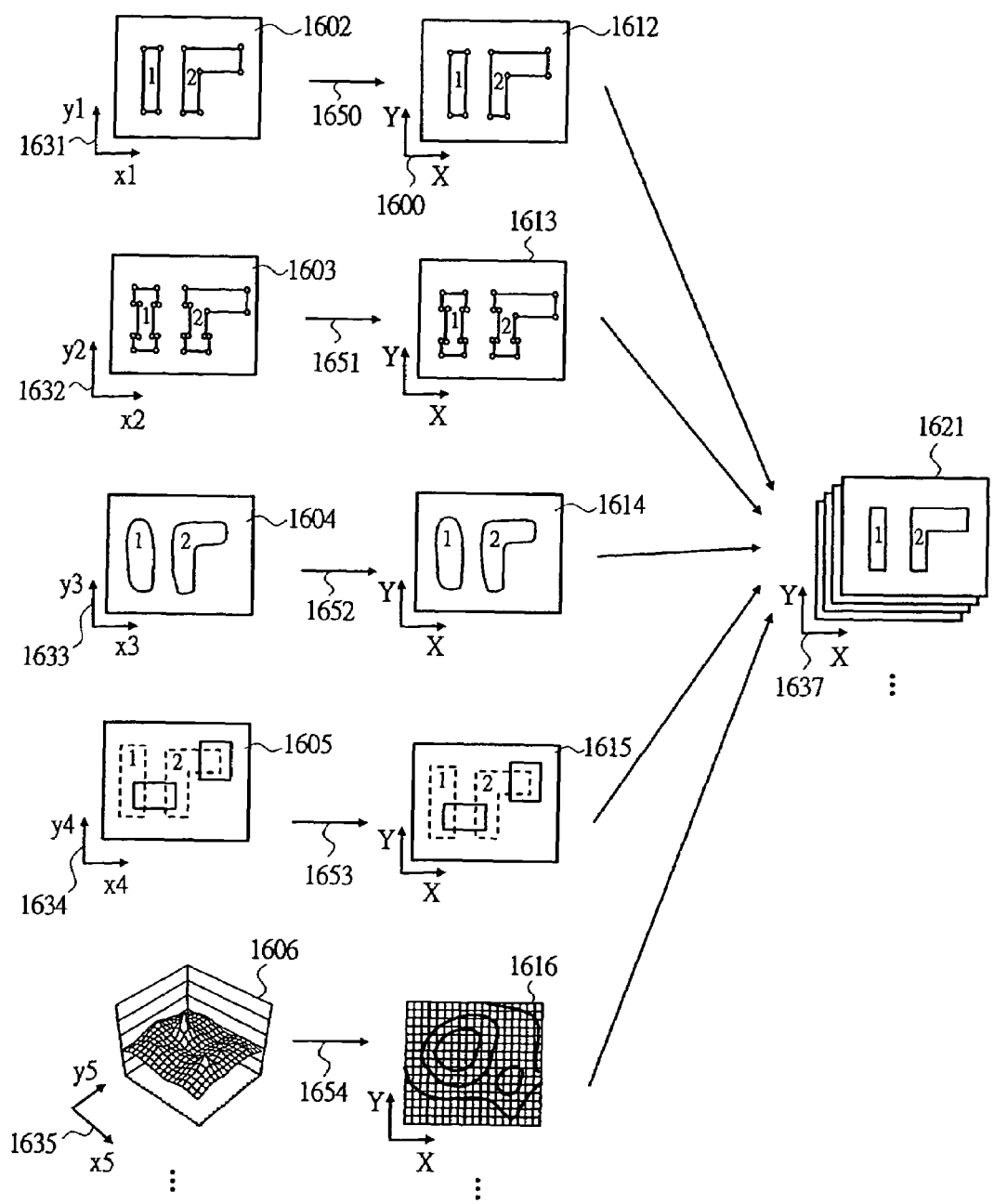
FIG. 14 is a diagram showing an example of linkage structure (absolute coordinate system) of the diversified data in the control method of the diversified data.
Figure 15:
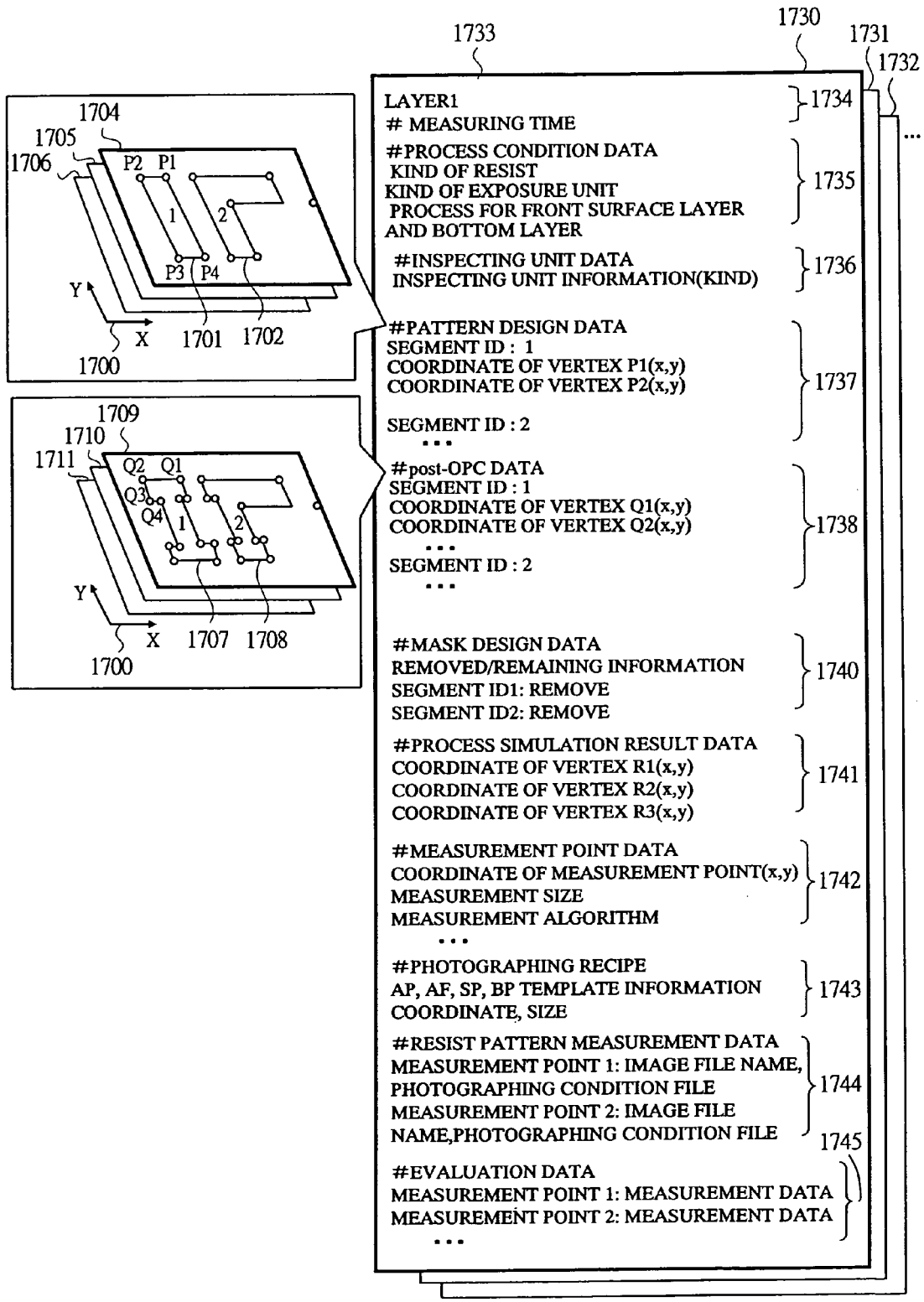
FIG. 15 is a diagram showing an example of data structure of linkage structure (absolute coordinate system) of the diversified data.

(Data Structure-Absolute Coordinate System: FIGS. 14 and 15)

FIG. 14 is a drawing showing an example of the linkage configuration of the diversified data in the control method of the above-diversified data. As one of the methods for securing matching of respective data possessed by the diversified data, a method of possessing all the coordinate systems of respective data under the same coordinate system 1600 is available. Particularly, often the coordinate systems of all other possessed data are converted to the pattern design data 1602 which are the basic data of CAD application system with its coordinate systems intersecting at right angle and having no distortion and stored. In this case, both coordinate systems turn to completely the same coordinate systems because the coordinate system 1632 of the pattern design data 1602 shown in FIG. 14 is expressed in the same coordinate system 1600. Next, other diversified data, for example, the coordinate system 1632 of the post-OPC pattern design data 1603 is converted to the same coordinate system by the coordinate conversion described in FIG. 10 (1651). Likewise, all the coordinate systems of the respective diversified data shown in FIGS. 6-8, for example, the process simulation result data 1604, the measuring point data 1605 and the template selection index value data 1606 of the photographing recipe, are converted to the same coordinate systems and after the coordinate system is converted, the data is stored in the database 1501.

An example of the data structure of this example is shown in FIG. 15. This is an example in which all data of the diversified data are stored in batch (1730) after the above coordinate conversion is carried out. The diversified data to be stored are all or part of the diversified data shown in FIGS. 6-8, for example, process condition data 1735, inspecting unit data 1736, pattern design data 1737, post-OPC data 1738, mask design data 1740, process simulation result data, measuring point data 1742, photographing recipe 1743, resist pattern measurement data 1744 and evaluation data 1745. In the meantime, only two segments are indicated as an example in the pattern design data 1737, post-OPC data 1738 and mask design data 1740. As described previously, sometimes data is controlled at each measuring time in order to control the diversified data in time-series fashion. In this case, measurement time 1734 is also stored. Data describing the diversified data in batch is controlled by each layer of the wafer (1730-1732). As a consequence, data control with matching of the coordinate systems secured among the diversified data is enabled. Further, the data control in time-series fashion is also enabled.

Figure 16:
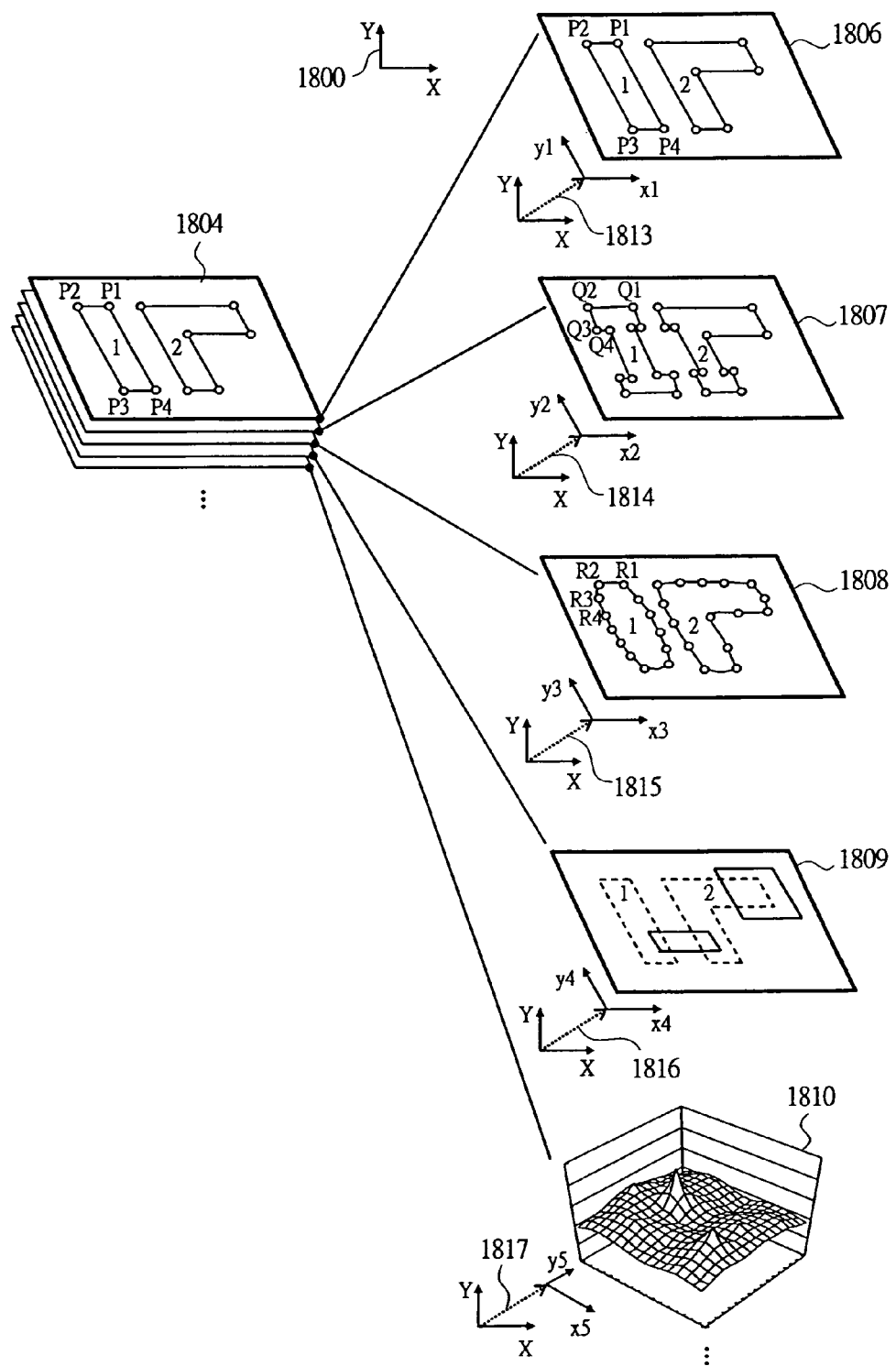
FIG. 16 is a diagram showing an example of linkage structure (relative coordinate system) in the control method of the diversified data.
Figure 17:
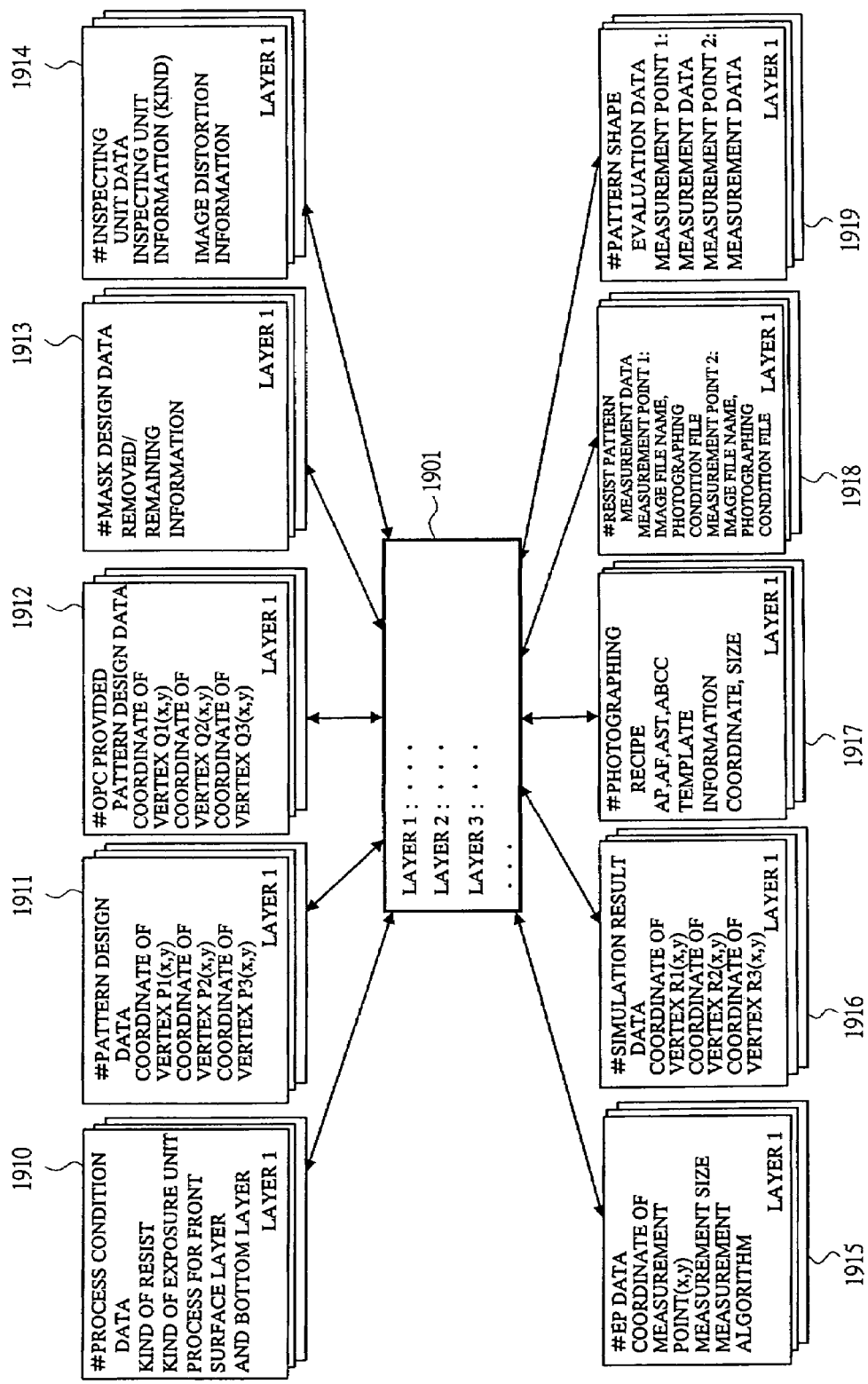
FIG. 17 is a diagram showing an example of data structure in linkage structure (relative coordinate system) of the diversified data.

(Data Structure-Relative Coordinate System (Use of Reference Table): FIGS. 16 and 17)

FIG. 16 is a drawing showing an example of the linkage configuration of the diversified data in the above-described diversified data control method. As one of the methods for securing matching among the respective data possessed by the diversified data 1804, a method of possessing the table data described later which possesses the correlation among the respective data coordinate systems is available. In this example, when each data is referred to, the table data is referred and a desired reference coordinate data is obtained by converting an inputted coordinate to the coordinate system of data to be referred to. For example, an absolute coordinate system 1800 unified among the respective data is set and the amount of conversion in the coordinate conversion described in FIG. 10 which converts each coordinate system of each data of the possessed diversified data 1804 to the unified absolute coordinate system is obtained and then stored in the table data. As shown in FIG. 16, a displacement at the time of converting each coordinate system of the diversified data shown in FIGS. 6-8, such as pattern design data 1806, OPC provided pattern data 1807, process simulation result data 1808, EP coordinate data 1809, photographing recipe selection index value data 1810 to the unified absolute coordinate system and conversion amounts 1813-1817 are computed and stored in the table data described later. The unified absolute coordinate system may be a coordinate system of data contained in the diversified data and particularly, often, the coordinate system of the pattern design data 1806, which are the basic data of the CAD application system with its coordinate systems intersecting at right angle and having no distortion, is often used as the unified absolute coordinate system.

FIG. 17 shows an example of the data structure of this example. The above information for converting the coordinate system of each data of the diversified data is stored in the table data 1901. When using each of the diversified data, each data is converted to the unified absolute coordinate system 1800 by referring to this table data 1901. The diversified data mentioned here are, as same as above, all or part of the respective diversified data shown in FIGS. 6-8 such as process condition data 1910, pattern design data 1911, OPC provided pattern design data 1912, mask design data 1913, inspecting unit data 1914, EP data 1915, simulation result data 1916, photographing recipe 1917, resist pattern measurement data 1916 and pattern shape evaluation data 1919. As a consequence, data control with matching among the coordinate systems of the diversified data secured and time-series data control are enabled.

(Example of Photographing Recipe Automatic Creation)

Figure 18:
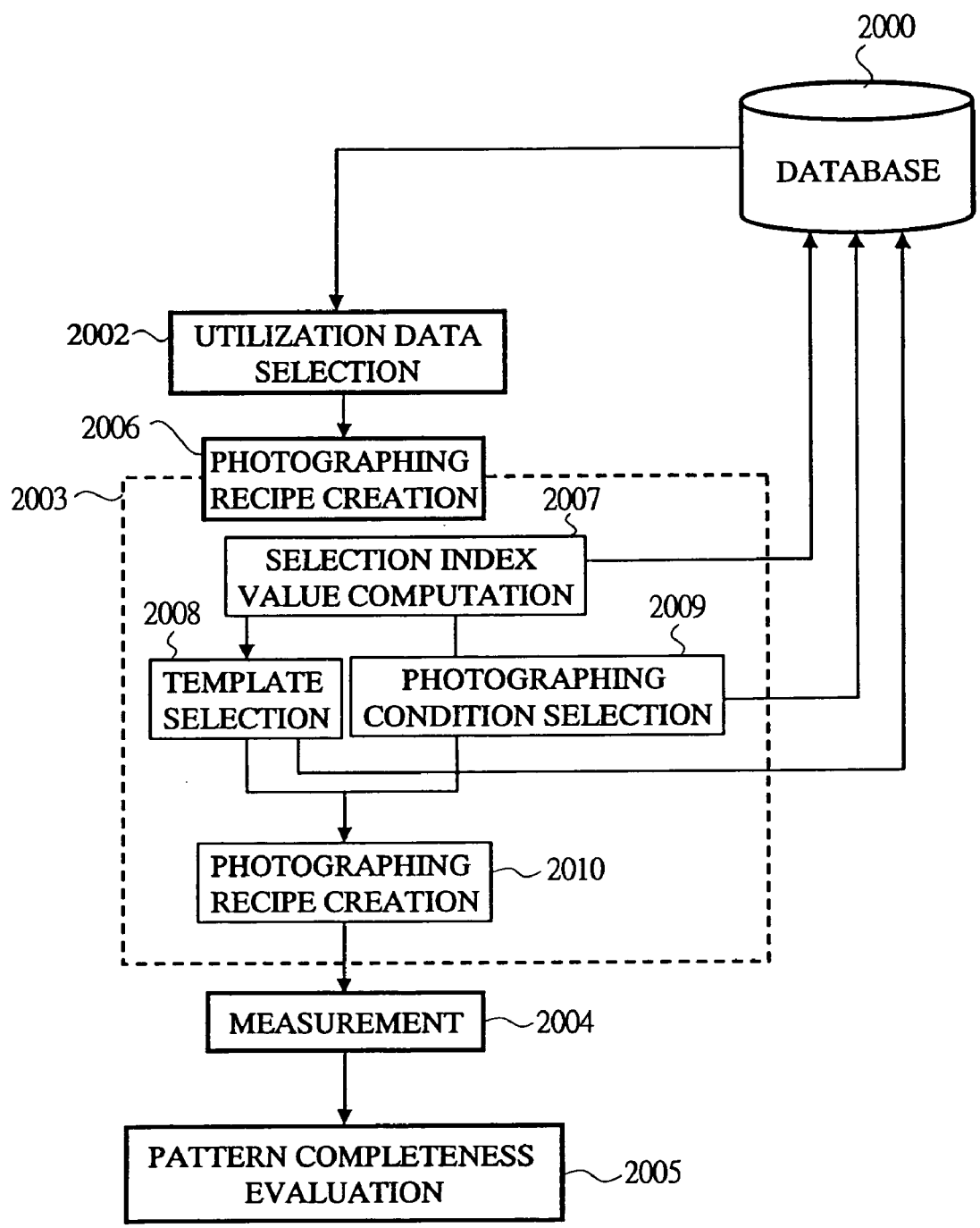
FIG. 18 is a diagram showing an example of processing flow of photographing recipe automatic creation.

(Outline: FIG. 18)

FIG. 18 is a diagram showing an example of processing flow of photographing recipe automatic creation of this embodiment. Data for use in photographing recipe creation is selected from the database 2000, which stores the diversified data (2002) and the diversified data selected by the photographing recipe creation portion 2003, is transferred through network. The photographing recipe creation portion 2003 computes index value 1001 for selecting the AP, FP, SP, BP templates required in the photographing recipe based on the pattern data (2007). At this time, the template may be computed using the process simulation result data as well as the pattern design data. Photographing recipe capable of achieving more stable measurement can be created because a pattern similar to an actually formed resist pattern is used when the process simulation data is used.

Next, the AP, FP, SP, BP templates are selected based on the computed template selection index value (2008) and photograph condition (for example, photographic magnification) of a measuring unit is selected (2009). Then, photographing recipe is created (2010). Completeness of the measurement data of the resist pattern is evaluated by measuring (2004) using the created photographing recipe 2010. As the evaluation method for the completeness, for example, pattern dimensional measurement or GAP measurement of measuring a difference relative to pattern design data is conducted. The photographing recipe is created using the diversified data to evaluate the completeness of the pattern shape. As a result, such a photographing recipe which enables stable measurement using absolutely necessary data and then possessed data if any is created. If no absolutely necessary data exists upon selection of data for use (2002), user is notified of the shortage of data and urged to input necessary data.

(Utilization of Process Simulation Result: FIG. 19)

Figure 19A:
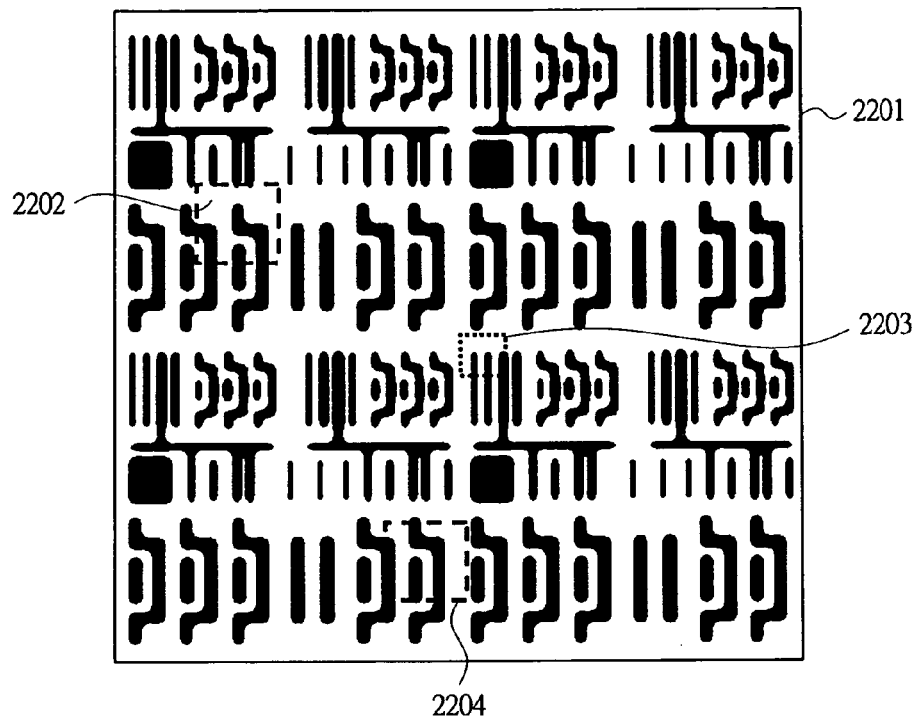
FIG. 19A is a diagram showing an example of creating the photographing recipe using process simulator result data.

FIG. 19A is a diagram showing an example of creation of the photographing recipe using the process simulation result data 2201 of the above diversified data of this embodiment. The formation resist pattern computed by a process simulator using the pattern design data 801, post-OPC pattern design data 802 or mask design data 805 and the process condition data 1005, stored in the diversified data, is the process simulation result data 807. If this data is compared with the pattern design data 802, a shape similar to the actual resist pattern formed in the exposure/development process is obtained. If each of the AP, FP, SP, BP templates is selected using the process simulation result data 2201 instead of selecting each of the AP, FP, SP, BP templates in the above-mentioned photographing recipe using the pattern design data, since a pattern having a shape similar to the actually formed pattern is used, so that such a photographing recipe which enables high accuracy, stable measurement can be created.

Figure 19B:
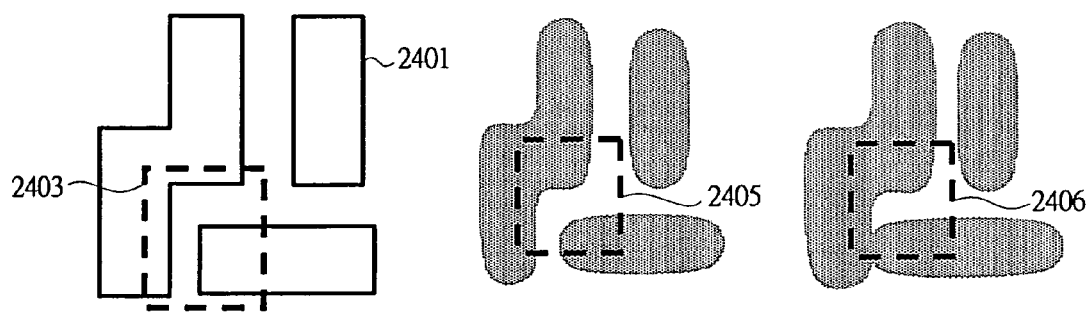
FIG. 19B is a diagram showing an example of creating the photographing recipe using the process simulator result data or an example in which the shape of a pattern formed by changing the process condition is unstable.
Figure 19C:
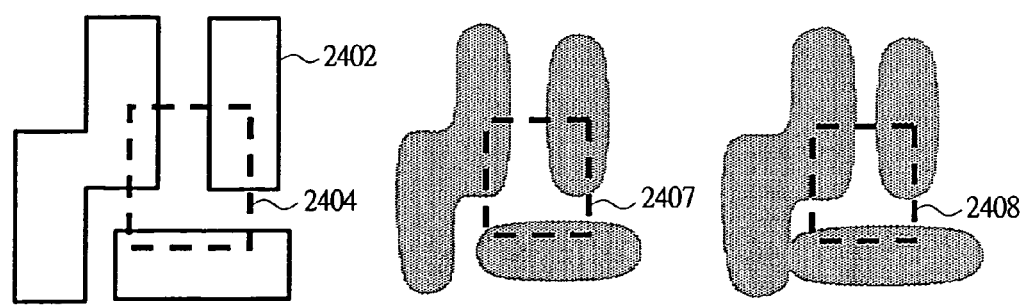
FIG. 19C is an example of creating the photographing recipe using process simulator result data or an example in which the shape of a pattern formed by changing the process condition is relatively stable.

FIGS. 19B and C are diagrams showing an example of creation of the photographing recipe using the process simulator. In this example also, a resist pattern to be formed is computed by changing the process condition within a range in which it can be changed by means of a process simulator using the pattern design data 801, post-OPC pattern design data 802, or mask measurement data 805 and the process condition data 1005 of the diversified data. For example, a template candidate area 2403 in CAD design pattern 2401 is an example (b) in which pattern shapes 2405, 2406 formed by changing the process condition are unstable. On the other hand, a template candidate area 2404 can be said to be an example (c) in which pattern shapes formed by changing the process condition are relatively stable. By not selecting a portion in which the pattern shape is likely to change by simulation depending on the condition as a template, such a photographing recipe, which enables stable measurement, can be formed.

(Example of Utilization of Diversified Data: FIG. 20)

FIGS. 20A to F are diagrams showing an example of creation of photographing recipe using the diversified data of this embodiment. In this example, a template pattern of the photographing recipe is created using a pattern data similar to a resist pattern to be formed using the possessed diversified data. Consequently, a photographing recipe, which enables more stable measurement, can be created.

FIG. 20A shows data about only layout data 2501 composed of a single layer. The template selection processing can be carried out with only this data and this data is absolutely necessary data for the template selection processing. FIG. 20B shows layout data 2502, 2503 composed of multiple layers, so that when multi-layer formed pattern is observed in an SEM image, a template near an actually observed image can be selected, so that a template, which enables stable measurement, can be selected.

FIG. 20C shows data 2506 in which mask information (removed/remained information) is added to the pattern design data. For example if it is assumed that the removed pattern is 2504 and the remained pattern is 2505, a pattern template near a measured image of an actually formed pattern can be selected because both the removed and remained patterns are data distinguished by the template, thereby enabling stable measurement. FIG. 20D shows data 2508, 2507 to which a difference in material of the formed pattern is added using the process condition, which are data near a trend of the SEM image of an actually formed pattern, thereby making it possible to select a template which enables stable measurement.

FIG. 20E shows data 2510, 2509 in which pattern shape formed by the process simulation is computed, so that a template, which enables stable measurement, can be selected by using data nearer the actually formed pattern. FIG. 20F shows simulation result data of a SEM image computed by electron beam simulation based on data computed by the process simulation, which is data nearer an image measured with the formed pattern SEM, thereby making it possible to select a template which enables more stable measurement.

(GUI: FIGS. 21-23)

Figure 21:
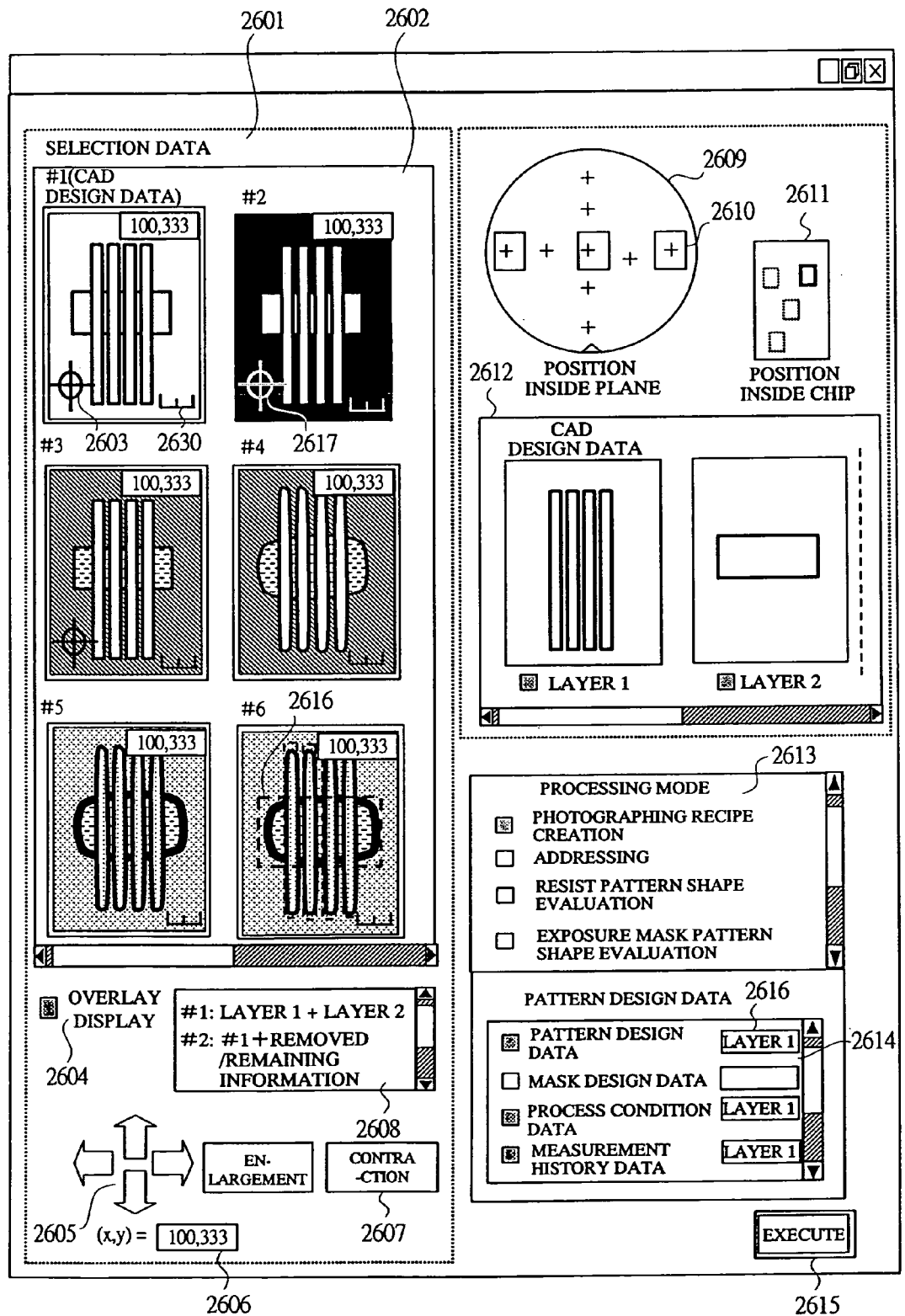
FIG. 21 is a diagram showing GUI which selects/displays diversified data for diversified data control.

FIG. 21 is a diagram showing the graphic user interface (GUI) which selects/displays the diversified data for the above-described diversified data control. Any plural data can be displayed on the GUI and at this time, different plural data can be displayed in an overlaid state at the same time. The aforementioned plural data includes all or part of the above diversified data. The diversified data can be displayed in an overlaid state and any coordinate can be referred to between respective data because they are controlled integratedly to secure matching among data and subjected to coordinate linkage.

FIG. 21 shows an example in which plural data for use in creation of the photographing recipe are displayed as an example of the display method. Selection data 2601 enables all or part of the diversified data to be display side by side and plural data to be displayed in an overlaid state by specifying data (2608) or specifying overlay display (2604). As an example of the overlay display, an example in which the SEM image and pattern design data are displayed in an overlay state is indicated in 2616. The dotted line indicates a pattern design data, where the design data is overlaid on the SEM image. Because coordinates are linked through respective data, the same coordinate on data can be referred to by specifying the coordinate 2603 on other data specified by any data (2630, 2617). Because all the diversified data such as the pattern design data are stored in the database, any coordinate on displayed individual data can be specified (2605) and individual data can be displayed in enlargement or contraction (2607).

Any coordinate on the wafer 2609 can be specified (2610) through the GUI because they are linked with one another and any position on a chip can be specified (2611). Further, because the storage data is stored for each layer of the wafer, data of any kind in each layer can be displayed side by side freely (2612) and any data can be selected through this GUI and data of different layers can be displayed in an overlaid state though the GUI (2601) for the selection data. For example, photographing recipe creation, addressing, resist pattern shape evaluation, exposure mask pattern shape evaluation, and other above processings can be specified through the GUI with the selected data. Data for use in each processing selected may be selected through the GUI for selection of data for use (2614). Further, the aforementioned layer for use may be used (2616). Further, various measurement results such as dimensional measurement conducted for evaluation of completeness of a pattern can be displayed in an overlaid state.

FIG. 22 is a drawing showing the GUI for output data for monitoring time-series data. Any data stored in the diversified data can be controlled in time-series fashion as described above, so that information of the diversified data can be confirmed through the GUI.

FIG. 22 shows an example that change in the addressing shift amount with time, measured with the critical dimension SEM, as an example of the diversified data, is displayed on the GUI. The change in the addressing shift amount with time when photographing is carried out with the template (1) 2701 and the template (2) 2702 is displayed over time expressed on its abscissa axis and the addressing shift amount expressed on its ordinate axis (2703, 2705). Further, the coordinate of a measuring object on the wafer can be displayed on a wafer map 2709 so that the chip to be monitored on the wafer can be specified. A variety of the templates within the chip can be displayed on the map 2701 in the chip and the kind of a template monitored through the GUI can be specified. A GUI 2711 for selecting a processing mode selects a mode 2717 for monitoring a measuring condition in time-series fashion. If the photographing recipe is corrected, a correcting object (for example AP) is specified through the GUI for an updating object recipe selection (2714), and data for use upon correcting is specified through the GUI for selection of data for use (2716) like in FIG. 21.

FIG. 23 is a drawing showing a reference GUI for the diversified data. Because plural data for use in the present invention are controlled integratedly to secure matching among the respective data and their coordinates are linked with one another, they can be displayed in an overlaid state.

Figure 23A:
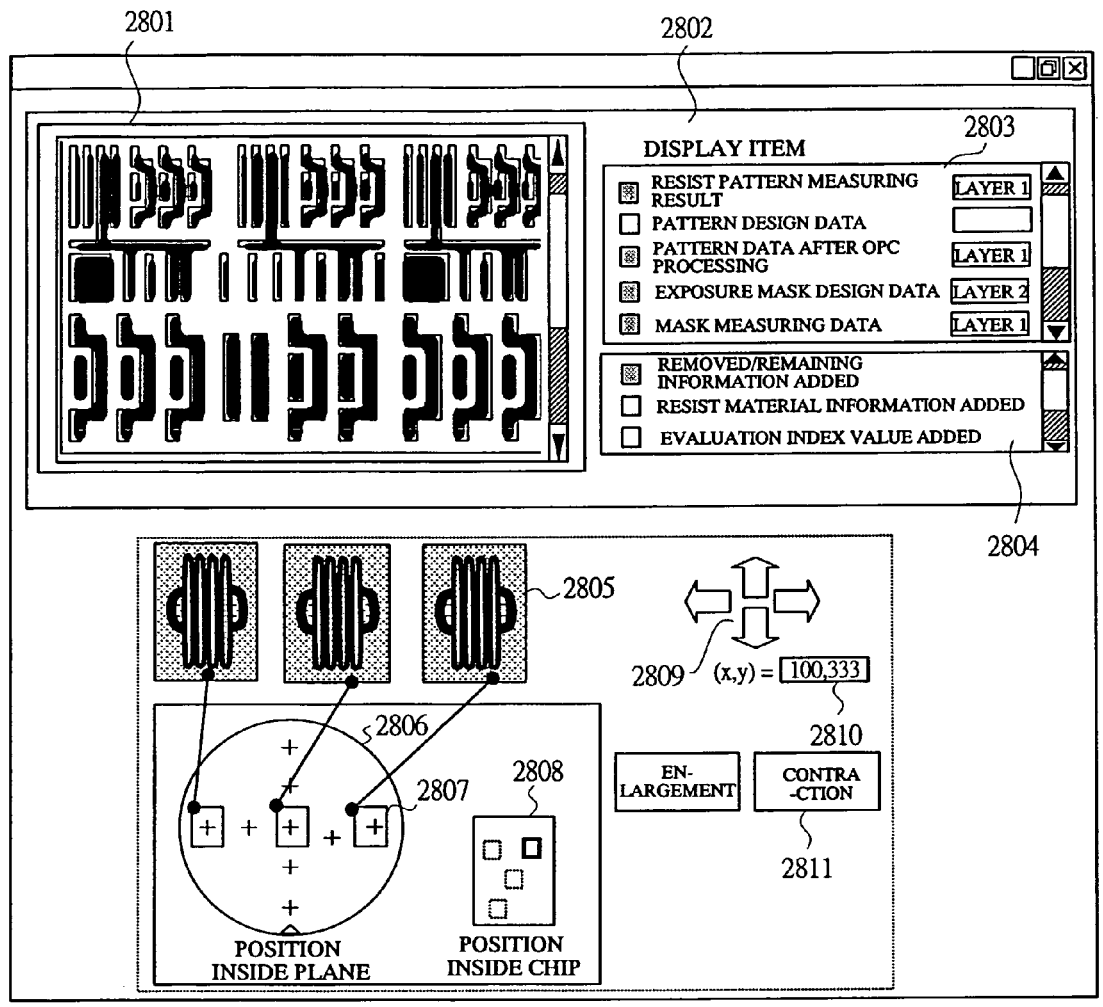
FIG. 23A is a diagram showing an example of the GUI which executes the overlay display.

FIG. 23A is a drawing showing an example of the GUI which displays in an overlaid state. This includes a GUI 2801 which displays plural data in an overlaid state. Data to be displayed in the overlaid state can be selected through a display item GUI 2802. A layer to be displayed can be specified like the GUI of FIG. 21 (2803). A plurality of the layers can be selected. Further, respective data may be displayed in the overlaid state by specifying any color for each data. As a consequence, a pattern formation state easy to see for user can be presented.

Figure 23B:
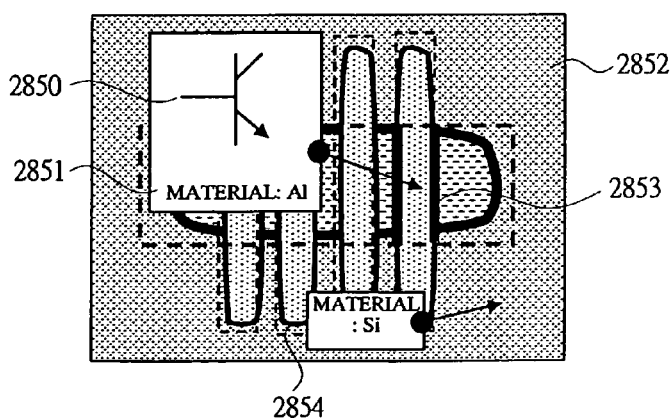
FIG. 23B is a diagram showing an example that the kinds of the formed pattern are displayed in an overlaid state.

Like FIG. 22, wafer map 2806 for specifying the position of display data on the wafer and chip interior map 2808 are displayed on the GUI to specify a place to be displayed in an overlaid state easily. Information of design specification at an arbitrary point on a pattern can be displayed and for example, the kind of function of a formation pattern can be displayed on the pattern in an overlaid state as shown in FIG. 23B (2850). Further, if the material information exists in the possessed data, it can be displayed in an overlaid state when that information is referred to (2851, 2854). As a consequence, an operator using the critical dimension SEM can determine what a measuring object is easily.

As described above, according to the embodiment of the present invention, data conversion corresponding to each process conventionally necessary becomes unnecessary by correlating coordinate systems of plural data for use in each process for pattern formation, pattern measurement, and pattern completeness evaluation. Further, because the possessed data is controlled integratedly, data effective for use in each process can be selected easily from the possessed data. Consequently, semiconductor pattern formation cycle time can be reduced, thereby achieving effective semiconductor manufacturing.

If the shape of a formed pattern changes with time when the diversified data are controlled in time-series fashion, the photographing recipe is corrected based on the time-series data to create such a photographing recipe which enables stable measurement.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is applicable in semiconductor manufacturing technology in recent years when due to reduction in design margin accompanying miniaturization and intensified density of design pattern in semiconductor manufacturing process, inspection portions which need dimensional control of the semiconductor pattern is increasing tremendously, and improvements of through-put and automatization of the SEM unit for use as a dimensional control tool have been demanded strongly. Particularly, the present invention controls design data of semiconductor pattern controlled as CAD data and plural data for use in pattern design integratedly and provides a method for making an effective use of plural data. Because the above method enables automatic creation of the photographing recipe or reduction of the creation time and accurate rapid measurement of multiple inspection positions, so that the characteristics of the semiconductor device and state of the manufacturing process can be estimated and its result can be fed back to the manufacturing process, the present invention can be utilized in entire semiconductor manufacturing technology.

What is claimed is:

1. An apparatus for evaluating the pattern shape of a semiconductor device, comprising:
    database means which stores CAD pattern design data describing layout information of a pattern of the semiconductor device and diversified data for use in pattern design;
    data processing means for controlling the diversified data stored in the database means;
    correlating means for correlating coordinate systems of the diversified data to control the data integratedly with the database processing means;
    selecting means for arbitrarily selecting part or all of the diversified data from the database; and
    creating means for creating a photographing recipe for observing the semiconductor pattern with a critical dimension scanning electron microscope (CD-SEM) using data selected by the selecting means.

2. The apparatus for evaluating the pattern shape of the semiconductor device according to claim 1, wherein the diversified data controlled integratedly by the data processing means include part or all of logic circuit design data, pattern design data describing arrangement information of a pattern in a semiconductor chip, process simulation result data, electron beam drawing pattern design data for use in drawing the pattern on an exposure mask, electron beam mask drawing simulation result data, pattern design data subjected to optical proximity effect correction, measurement data of pattern on exposure mask, measurement data of formed resist pattern, measurement data of formed etching pattern, measurement condition data of each measuring unit, process parameter data, condition data of each measuring unit, resist pattern evaluation result data, and measurement recipe of each measuring unit.

3. The apparatus for evaluating the pattern shape of the semiconductor device according to claim 1, wherein the correlating means converts the diversified data to unified coordinate system and store in the database to correlate coordinate systems of the diversified data and possesses a conversion table for the coordinate conversion.

4. The apparatus for evaluating the pattern shape of the semiconductor device according to claim 3, wherein the correlating means performs all or part of processing for displacing the coordinate system of each of the diversified data, rotation processing of the coordinate system of each of the diversified data and scale conversion processing of the coordinate system of each of the diversified data as a method for correlating the coordinate system among the diversified data.

5. The apparatus for evaluating the pattern shape of the semiconductor device according to claim 3, wherein the correlating means employs the coordinate system of the pattern design data as a method for correlating the coordinate systems among the diversified data and converts the coordinate system of other diversified data to the coordinate system of the pattern design data.

6. The apparatus for evaluating the pattern shape of the semiconductor device according to claim 1, wherein the data processing means controls the diversified data in time-series fashion.

7. The apparatus for evaluating the pattern shape of the semiconductor device according to claim 6, wherein the data processing means monitors a change in the amount of position shift of pattern measurement with time using data controlled in the time-series fashion and if the change amount of the position shift amount exceeds a specified amount, corrects photographing recipe.

8. The apparatus for evaluating the pattern shape of the semiconductor device according to claim 1, wherein the database means is connected to a plurality of semiconductor manufacturing apparatuses through network; possesses the diversified data among the connected plural semiconductor manufacturing apparatuses; selects arbitrary data corresponding to processing of each step from the diversified data in each step for recipe creation or formed pattern shape evaluation or pattern creation; executes the processing of each step using the selected data; and feeds back a result of the processing to a last step.

9. The apparatus for evaluating the pattern shape of the semiconductor device according to claim 1, further comprising a display means, which displays all or part of the diversified data selected arbitrarily by the selecting means side by side or in an overlaid state.

10. A method for evaluating the pattern shape of the semiconductor device comprising steps of:
storing CAD pattern design data describing layout information of a pattern of the semiconductor device and diversified data for use in pattern design;
controlling the diversified data stored in a database;
correlating coordinate systems of the diversified data to control the data integratedly with a database processing means;
selecting part or all of the diversified data from the database; and creating a photographing recipe for observing the semiconductor pattern with a critical dimension scanning electron microscope (OD-SEM) using data selected by a selecting means.

11. The method for evaluating the pattern shape of the semiconductor device according to claim 10, wherein the diversified data include part or all of logic circuit design data, pattern design data describing arrangement information of a pattern in a semiconductor chip, process simulation result data, electron beam drawing pattern design data for use in drawing the pattern on an exposure mask, electron beam mask drawing simulation result data, pattern design data subjected to optical proximity effect correction, measurement data of pattern on exposure mask, measurement data of formed resist pattern, measurement data of formed etching pattern, measurement condition data of each measuring unit, process parameter data, condition data of each measuring unit, resist pattern evaluation result data, and measurement recipe of each measuring unit.

12. The method for evaluating the pattern shape of the semiconductor device according to claim 10, wherein to correlate the coordinate systems among the diversified data, the diversified data is converted to unified coordinate system and stored in the database or a conversion table for the coordinate conversion is possessed.

13. The method for evaluating the pattern shape of the semiconductor device according to claim 12, wherein all or part of processing for displacing the coordinate system of each of the diversified data, rotation processing of the coordinate system of each of the diversified data and scale conversion processing of the coordinate system of each of the diversified data is performed as a method for correlating the coordinate systems among the diversified data.

14. The method for evaluating the pattern shape of the semiconductor device according to claim 12, wherein the coordinate system of the pattern design data is employed as a unified coordinate system and the coordinate system of other diversified data is converted to the coordinate system of the pattern design data as a method for correlating the coordinate systems among the diversified data.

15. The method for evaluating the pattern shape of the semiconductor device according to claim 10, wherein the diversified data is controlled in time-series fashion.

16. The method for evaluating the pattern shape of the semiconductor device according to claim 15, wherein a change in the amount of position shift of pattern measurement with time is monitored using data controlled in the time-series fashion and if the change amount of the position shift amount exceeds a set amount, photographing recipe is corrected.

17. The method for evaluating the pattern shape of the semiconductor device according to claim 10, wherein the diversified data are shared between the database and respective semiconductor manufacturing apparatuses connected through network; arbitrary data is selected corresponding to processing of each step from the diversified data in each step for recipe creation or formed pattern shape evaluation or pattern creation; the processing of each step is executed using the selected data; and a result of the processing is fed back to a last step.

18. The method for evaluating the pattern shape of the semiconductor device according to claim 10, wherein all or part of the diversified data is displayed side by side or in an overlaid state on a screen.

* * * * *